United States Patent
Yamaguchi et al.

(10) Patent No.: US 6,774,043 B2
(45) Date of Patent: Aug. 10, 2004

(54) METHOD OF MANUFACTURING SEMICONDUCTOR DEVICE

(75) Inventors: Atsumi Yamaguchi, Tokyo (JP); Kouichirou Tsujita, Tokyo (JP)

(73) Assignee: Renesas Technology Corp., Tokyo (JP)

(*) Notice: Subject to any disclaimer, the term of this patent is extended or adjusted under 35 U.S.C. 154(b) by 180 days.

(21) Appl. No.: 09/915,396

(22) Filed: Jul. 27, 2001

(65) Prior Publication Data

US 2002/0013055 A1 Jan. 31, 2002

Related U.S. Application Data

(63) Continuation-in-part of application No. 09/668,382, filed on Sep. 25, 2000, now abandoned.

(30) Foreign Application Priority Data

Apr. 12, 2000 (JP) .................................. P2000-110603
Feb. 27, 2001 (JP) .................................. P2001-051447

(51) Int. Cl.[7] .......................................... H01L 21/302
(52) U.S. Cl. ................... 438/705; 438/719; 438/720; 438/723; 438/724; 216/62; 216/81
(58) Field of Search .......................... 438/703, 704, 438/706, 712, 719, 720, 723, 724; 430/311–314, 323–326, 329, 281.1; 216/47

(56) References Cited

U.S. PATENT DOCUMENTS 4,068,018 A * 1/1978 Hashimoto et al. ............ 427/38
4,253,888 A * 3/1981 Kikuchi ...................... 148/187
5,767,018 A * 6/1998 Bell ........................... 438/696
5,981,149 A   11/1999 Yamaguchi
6,200,903 B1 * 3/2001 Oh et al. ..................... 438/705
6,518,615 B1 * 2/2003 Geusic et al. ................ 257/301

FOREIGN PATENT DOCUMENTS

| JP | 63-43319 | | 2/1988 | |
| JP | 4-127518 | * | 4/1992 | .......... H01L/21/27 |
| JP | 8-97425 | | 4/1996 | |
| JP | 9-36361 | | 2/1997 | |
| JP | 10-32264 | | 2/1998 | |

OTHER PUBLICATIONS

Wolf et al., Silicon Processing for the VLSI Era, vol. 1, 1986, pp. 181–182, 191–195, 407–408.*
U.S. patent application Ser. No. 09/413,723, filed Oct. 7, 1999, allowed.
U.S. patent application Ser. No. 09/915,396, filed Jul. 27, 2001, pending.

* cited by examiner

Primary Examiner—Duy-Vu Deo
(74) Attorney, Agent, or Firm—Oblon, Spivak, McClelland, Maier & Neustadt, P.C.

(57) ABSTRACT

Ions are implanted into a resist pattern for forming a wiring pattern. Argon is employed as the ion species, for performing ion implantation under 50 keV at $1\times10^{16}/cm^2$. Due to the ion implantation, the thickness of the resist pattern contracts to about 334 nm, i.e., about 75% of the thickness of 445 nm before ion implantation, while the composition of the resist pattern changes for improving resistance against etching for a silicon nitride film and a polysilicon layer. Thus obtained is a method of manufacturing a semiconductor device capable of suppressing critical dimension shift density difference (difference between a critical dimension shift on a rough region having a relatively large space width and that on a dense region having a relatively small space width).

18 Claims, 45 Drawing Sheets

F I G . 1
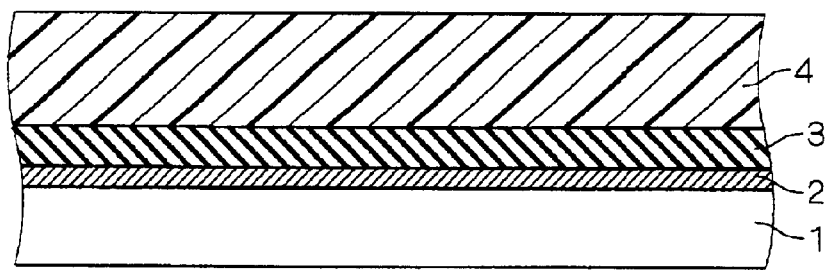
F I G . 2
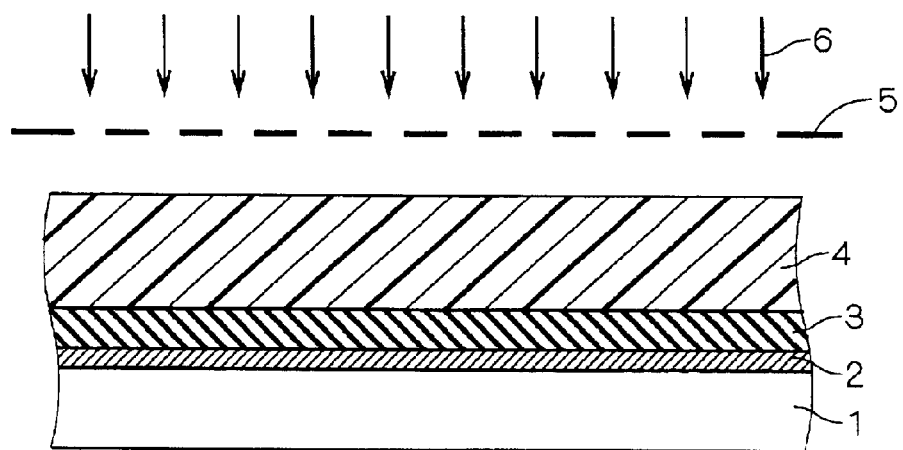

F I G . 3
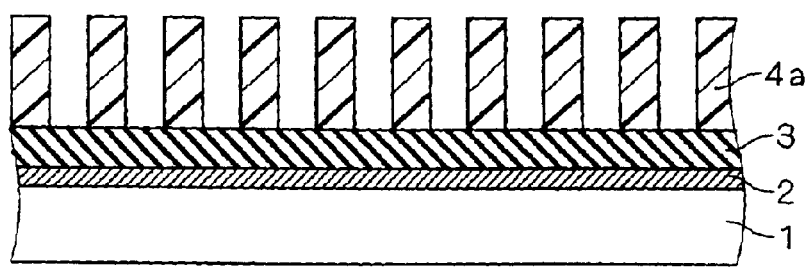
F I G . 4
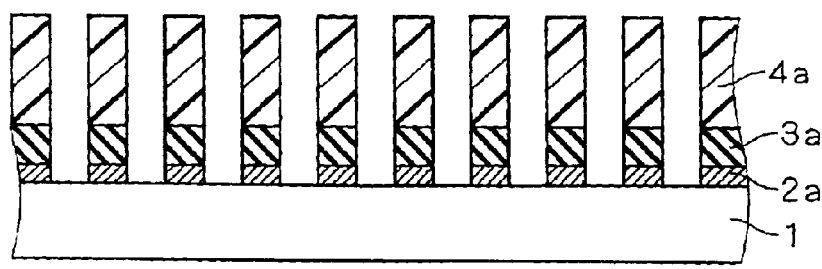

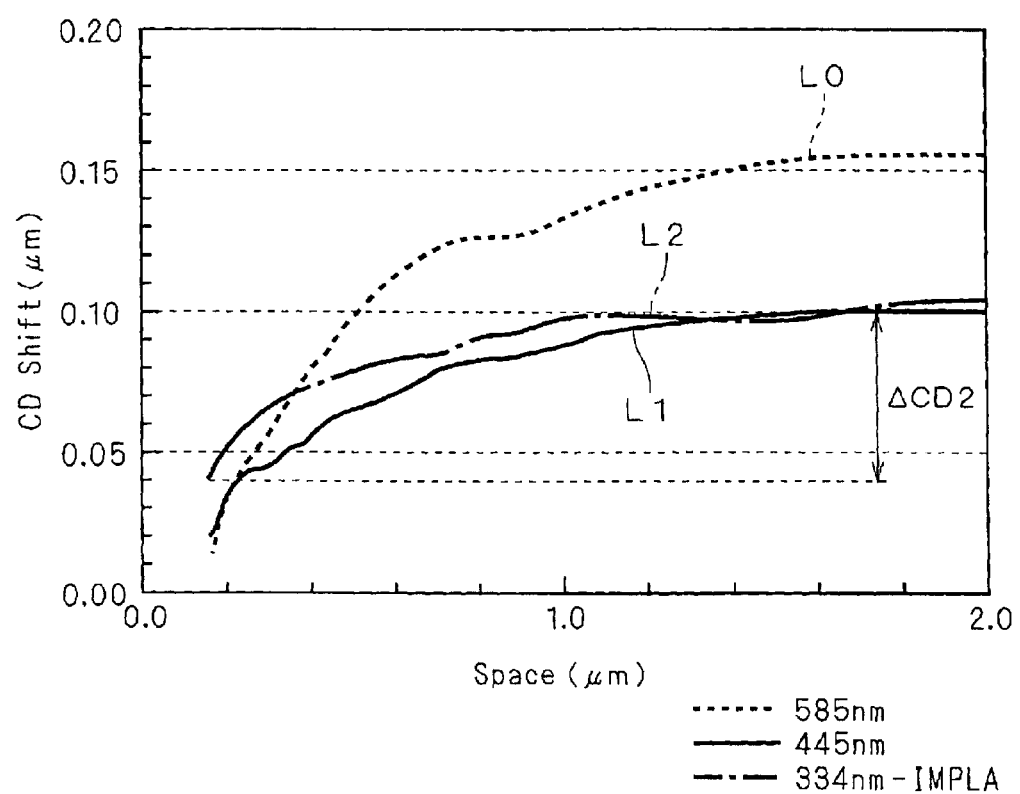
F I G . 1 2

F I G . 1 3
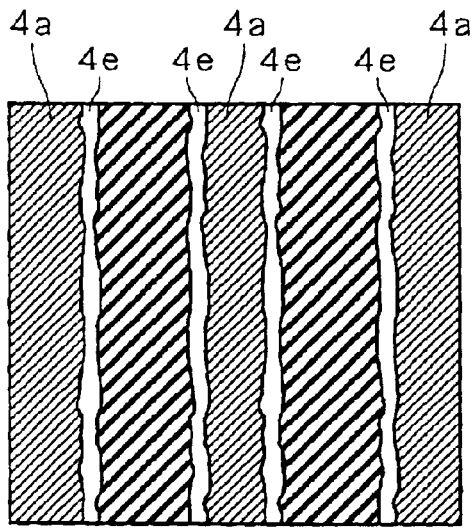
RESIST PATTERN AFTER DEVELOPMENT
F I G . 1 4
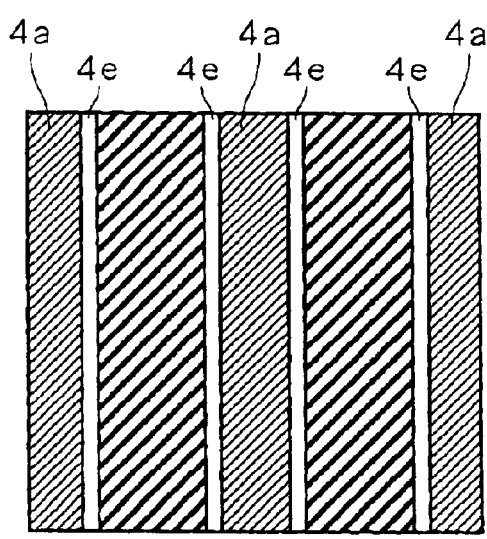
RESIST PATTERN
AFTER Ar ION IMPLANTATION F I G . 1 5
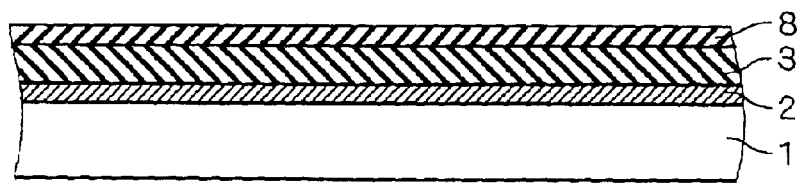
F I G . 1 6
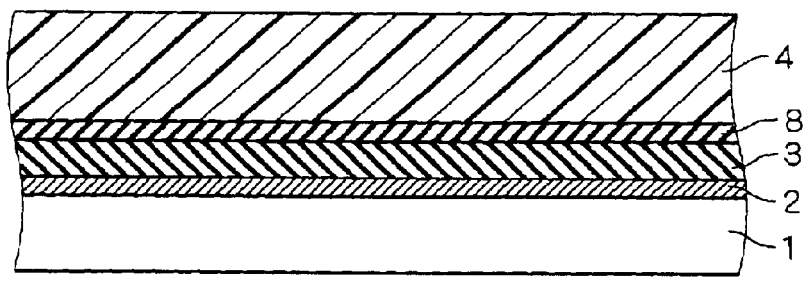
F I G . 1 7
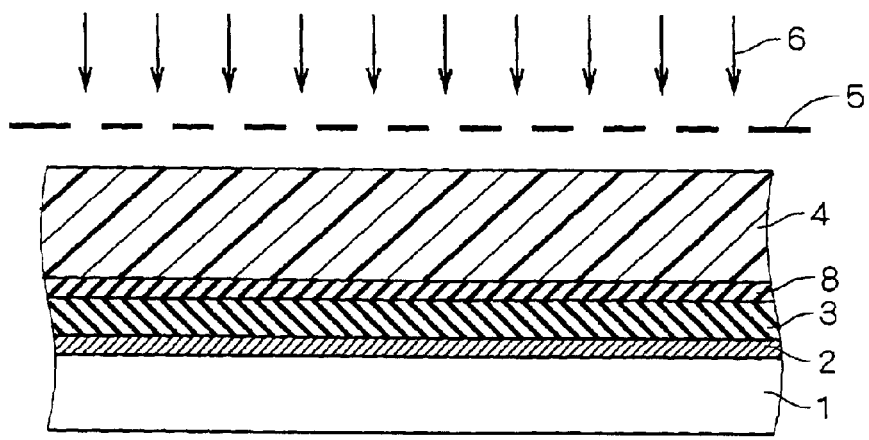

F I G. 2 1
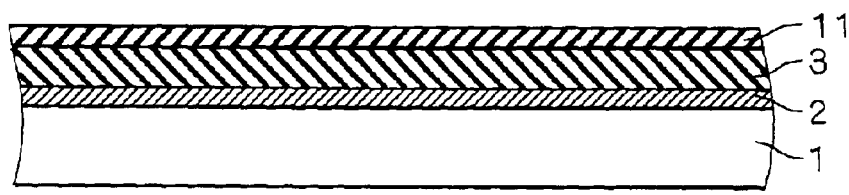
F I G. 2 2
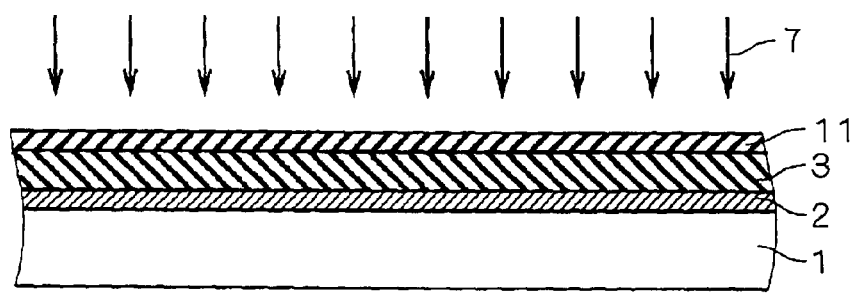
F I G. 2 3
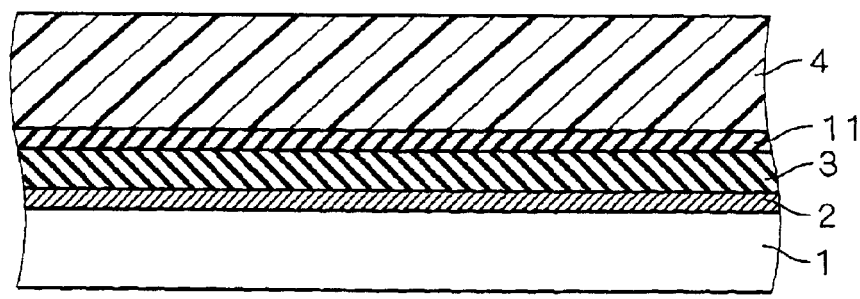

FIG. 36
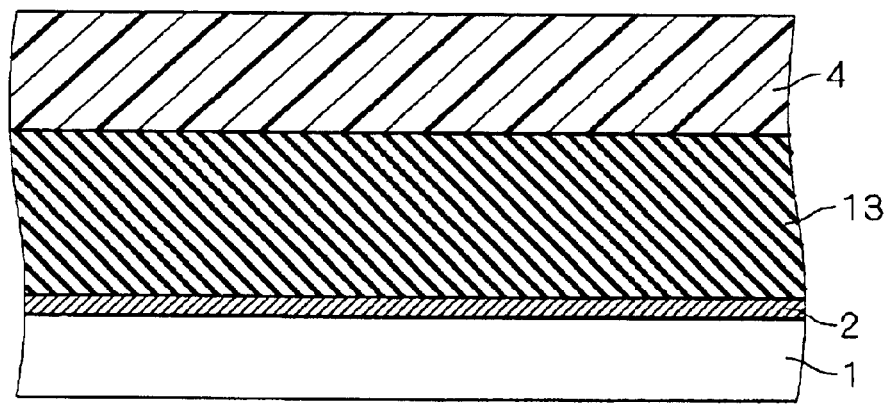
FIG. 37
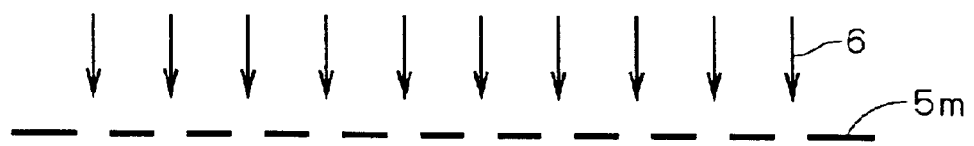
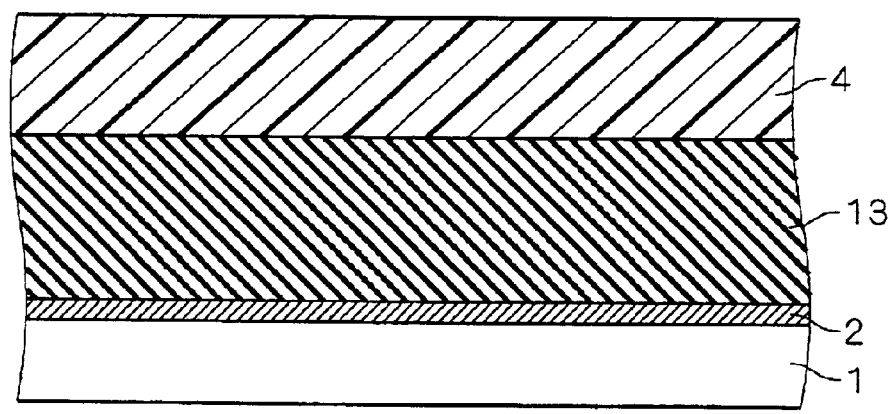

F I G . 3 8
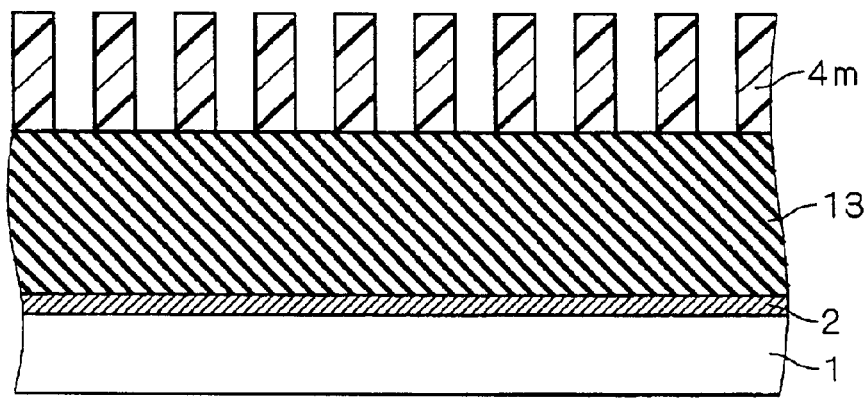
F I G . 3 9
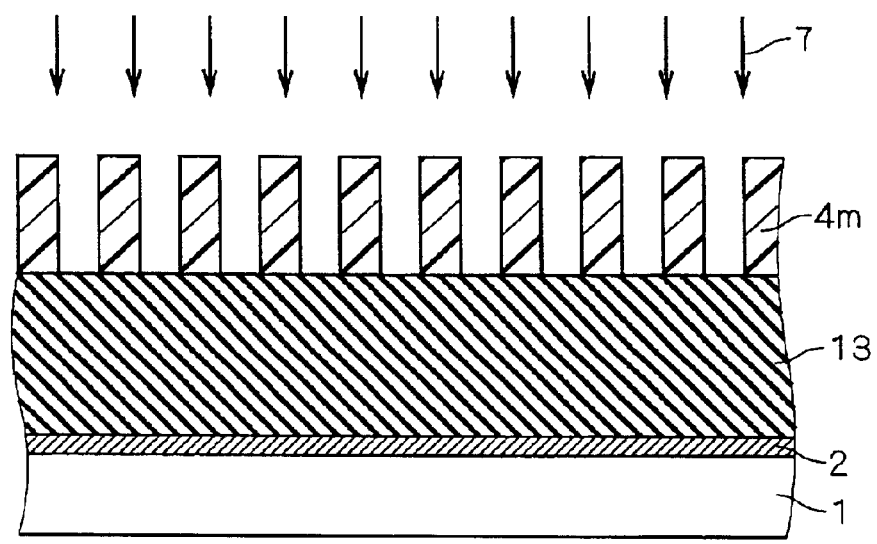

F I G . 44
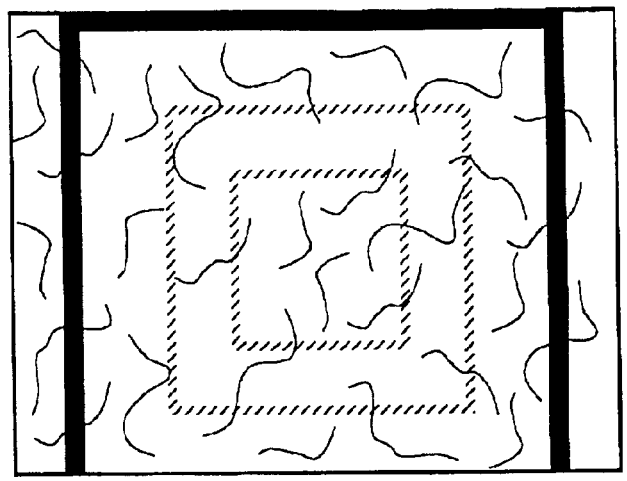
F I G . 45
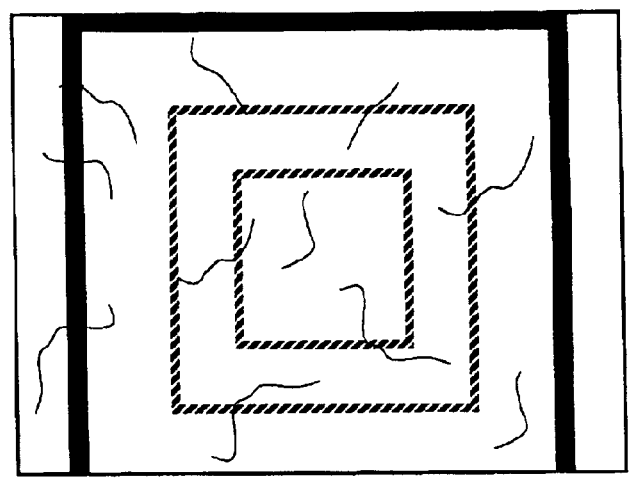

METHOD OF MANUFACTURING SEMICONDUCTOR DEVICE

This application is a continuation-in-part of Ser. No. 09/668,382 filed on Sep. 25, 2000 now abandoned.

BACKGROUND OF THE INVENTION

1. Field of the Invention

The present invention relates to a method of manufacturing a semiconductor device, and more particularly, it relates to a method of forming a work pattern including resist pattern formation utilized for manufacturing a semiconductor integrated circuit device, particularly a resist pattern forming step effective for obtaining high dimensional accuracy and alignment accuracy of a wiring pattern or the like having a line width of not more than 0.20 μm.

2. Description of the Background Art

When manufacturing a semiconductor integrated circuit (semiconductor device) at present, selective working is performed on an underlayer such as a semiconductor substrate through etching or ion implantation. In this case, a pattern of a composition sensitized by active rays such as ultraviolet rays, X-rays or electron rays, i.e., the so-called photosensitive resist coating (hereinafter simply referred to as "resist film") is formed on the underlayer, in order to selectively protect a worked portion of the underlayer.

The most generally employed method of forming a resist pattern is carried out through application of ultraviolet rays employing a stepping projection aligner (stepper) having a light source of a mercury lamp for g rays (wavelength: 436 nm) or i rays (wavelength: 365 nm), a KrF excimer laser (wavelength: 248 nm) or an ArF excimer laser (wavelength: 193 nm).

A photomask is mounted on the stepper for performing exposure, while the photomask, referred to as a reticle, obtained by forming a circuit pattern on a glass substrate with a shielding film of chromium (Cr) or the like must be precisely aligned (overlaid) for correctly setting positional relation between the photomask and a circuit pattern already formed on the substrate.

The pattern drawn on the photomask is contracted through a lens and transferred to the resist film applied to the semiconductor substrate. Thereafter the resist film is developed thereby enabling formation of a resist pattern.

It is assumed that this resist pattern forming step must be repeated by about 20 to 30 times in general, in order to manufacture a semiconductor integrated circuit device.

The degree of integration and the performance of a semiconductor integrated circuit are increasingly improved in recent years, followed by requirement for further refinement of a circuit pattern. In relation to a DRAM (dynamic random access memory), for example, a resist pattern having a line width of 0.20 to 0.18 μm is drawn on a 64-Mbit DRAM subjected to mass production at present, and a KrF excimer laser beam (λ=248 nm) is most generally utilized in a photolithography step therefore among ultraviolet rays. Further refinement of the pattern as well as improvement of dimensional accuracy and alignment accuracy are required for the future.

While a work pattern such as a wiring pattern is obtained by etching an underlayer film through a mask of a resist pattern, it has recently been recognized that there is such space width dependency (pattern density dependency) in formation of the work pattern that a critical dimension shift (the quantity of displacement from a resist pattern) resulting from dry etching varies with the space width of a region adjacent to the work pattern.

In other words, it has been recognized that the critical dimension shift on a rough region having a relatively large space width differs from that on a dense region having a relatively small space width on the work pattern. The difference between the critical dimension shift on the rough region having a relatively large space width and that on the dense region having a relatively small space width is hereinafter referred to as "critical dimension shift density difference".

This means that the dimensional accuracy of the work pattern is deteriorated in etching due to the space width dependency, while the critical dimension shift density difference is reaching an unignorable level following pattern refinement.

In particular, it is also recognized that large critical dimension shift density difference results from etching of a silicon oxide film or a silicon nitride film. However, the pitch of wires and the space between the wires and contact holes are increasingly narrowed due to the refinement and densification of the pattern and a self-aligned contact hole structure is generally employed. Therefore, a device structure obtained by stacking an insulator film such as a silicon oxide film or a silicon nitride film on a metal wiring film is requisite also in a gate forming step.

Therefore, a method of suppressing critical dimension shift density difference resulting from etching of the insulator film is necessary.

FIGS. 48 to 51 are sectional views showing an exemplary conventional wiring pattern forming method. The conventional wiring pattern forming method is now described with reference to FIGS. 48 to 51.

First, a polysilicon layer 2 is formed on a silicon substrate 1 in a thickness of 50 nm (500 Å), then a silicon nitride film 3 is formed in a thickness of 165 nm (1650 Å), and thereafter a photoresist film 4 is applied and prebaked at 100° C. for 90 seconds, as shown in FIG. 48. At this time, the revolution speed in application is so adjusted that the thickness of the photoresist film 4 is 585 nm (5850 Å).

Then, exposure is performed with a stepper having a KrF excimer laser (wavelength: 248 nm) 6 as a light source through a reticle (photomask) 5 on which wiring patterns are drawn at various pitches, as shown in FIG. 49. Off-axis illumination employing a ⅔ annular illumination aperture is applied under an illumination condition of NA (numerical aperture) =0.55.

Then, post-exposure baking (PEB) is performed at 110° C. for 90 seconds and thereafter development is performed for 60 seconds with an aqueous solution of 2.38 percent by weight of tetramethylammonium hydroxide (TMAH), thereby obtaining a resist pattern 4a responsive to the reticle 5 as shown in FIG. 50.

Then, the resist pattern 4a is employed as a mask for etching the nitride film 3 and the polysilicon layer 2 through a parallel plate reactive ion etcher performing RIE (reactive ion etching) with a gas mixture of trifluoromethane ($CHF_3$), tetrafluoromethane ($CF_4$), argon (Ar) and oxygen ($O_2$), thereby obtaining a wiring pattern (polysilicon pattern 2a and silicon nitride pattern 3a) as shown in FIG. 51.

FIG. 52 is a graph showing results of comparison of pattern sizes of the resist pattern 4a and a work pattern (multilayer structure of the polysilicon layer 2 and the silicon nitride film 3) obtained after etching. FIG. 52 plots the sizes (Line Width) of the resist pattern 4a and the work pattern subjected to etching, with reference to a line width of 0.24 μm, with respect to space widths (Space) respectively.

FIG. 53 is a graph showing space width dependency based on FIG. 52. This graph shows dependency of critical dimension shift (CD (critical dimension) Shift) in etching at the line width of 0.24 μm shown in FIG. 52 on the space width of an adjacent region. Referring to FIG. 53, critical dimension shift density difference Δ CD0 indicating the difference between critical dimension shifts of a densest pattern region and an isolated line pattern region having a sufficiently wide space is about 0.141 μm.

As shown in FIG. 53, the critical dimension shift of a line pattern under rough environment is so large that sizing is necessary for narrowing a mask size from an original design size, in order to finish the isolated line pattern in response to the design. However, process tolerance such as exposure tolerance or focus tolerance (DOF: depth of focus) is narrowed as the mask size and the obtained resist pattern size are reduced, and hence it is undesirable that critical dimension shift density difference resulting from etching is large.

Therefore, it is important to suppress the critical dimension shift in dry etching, particularly space width dependency (pattern density dependency) of the critical dimension shift, i.e., critical dimension shift density difference.

When forming a resist pattern on an underlayer film of tungsten or aluminum having large grains on its surface following pattern refinement, deterioration of pattern dimensional accuracy is caused due to influence by halation from the grains. Also in relation to alignment in exposure, accuracy is similarly deteriorated due to the influence by the grains.

SUMMARY OF THE INVENTION

According to a first aspect of the present invention, a method of manufacturing a semiconductor device comprises steps of (a) forming an etching object on a semiconductor substrate, (b) forming a first resist film on the etching object, (c) patterning the first resist film to obtain a first resist pattern, (d) performing ion implantation into the first resist pattern, the thickness of the first resist pattern contracting by the ion implantation in the step (d), and (e) executing predetermined etching on the etching object using the first resist pattern as a mask to obtain a work pattern after execution of the steps (c) and (d), and the thickness of the first resist pattern after execution of the step (d) is set to a level satisfying such a condition that difference in critical dimension shift in the work pattern with respect to the first resist pattern caused between a dense pattern portion and a rough pattern portion in the work pattern is not more than a predetermined reference value and causes no hindrance to the predetermined etching.

In the method of manufacturing a semiconductor device according to the first aspect, as hereinabove described, the step (d) is so executed as to set the thickness of the first resist pattern to a level satisfying the condition that difference in critical dimension shift in the work pattern with respect to the first resist pattern caused between a dense pattern portion and a rough pattern portion in the work pattern is not more than the predetermined reference value and causes no hindrance to the predetermined etching, whereby the work pattern can be obtained with excellent dimensional accuracy through the step (e) also when the etching object is an insulating material and the work pattern has relatively large density difference.

Further, the first resist pattern is subjected to ion implantation through the processing in the step (d) to be improved in resistance against the predetermined etching, not to exert bad influence on the predetermined etching also when the thickness of the first resist pattern is reduced.

In addition, ion implantation is performed on the first resist pattern through the processing in the step (d) for relaxing roughness on an edge portion of the first resist pattern, whereby the first resist pattern can attain excellent linearity.

According to a second aspect of the present invention, the etching object includes an actual etching object and an ion prevention film, the step (a) includes steps of (a-1) forming the actual etching object on the semiconductor substrate and (a-2) forming the ion prevention film on the actual etching object, the ion implantation in the step (d) includes ion implantation from above the first resist pattern, and the ion prevention film prevents ions implanted in the step (d) from being implanted into the actual etching object.

In the method of manufacturing a semiconductor device according to the second aspect, the ion prevention film prevents the ions implanted in the step (d) from being implanted into the actual etching object, not to exert bad influence on the actual etching object by the ion implantation.

According to a third aspect of the present invention, the ion prevention film includes a silicon nitride film or a silicon oxynitride film, and the step (a-2) includes a step of forming the ion prevention film by plasma CVD.

In the method of manufacturing a semiconductor device according to the third aspect, the silicon nitride film or the silicon oxynitride film can be formed in a uniform thickness due to plasma CVD, not to exert bad influence on the shape of the first resist pattern.

According to a fourth aspect of the present invention, the ion prevention film includes an organic antireflection coating.

In the method of manufacturing a semiconductor device according to the fourth aspect, the ion prevention film includes the organic antireflection coating whose thickness contracts to reduce a step through ion implantation, whereby a step of the etching object can be flattened as compared with that before ion implantation and dimensional ununiformity of the work pattern caused by the step in the predetermined etching can be reduced.

According to a fifth aspect of the present invention, the step (a) further includes a step (a-3) of performing ion implantation into the organic antireflection coating forming the ion prevention film.

In the method of manufacturing a semiconductor device according to the fifth aspect, the step of the etching object can be remarkably flattened due to the ion implantation performed when carrying out the step (a-3) in addition to the step (d), whereby dimensional ununiformity of the work pattern caused by the step in the predetermined etching can be further reduced.

According to a sixth aspect of the present invention, the etching object includes first and second work areas, the first resist pattern includes a pattern for an etching mask for the first work area, the method further includes steps of (f) forming a second resist film at least on the second work area after execution of the step (d) and (g) patterning the second resist film to obtain a second resist pattern for an etching mask for the second work area, and the step (e) includes a step of executing the predetermined etching using the second resist pattern as a mask in addition to the first resist pattern.

In the method of manufacturing a semiconductor device according to the sixth aspect, a work pattern varied in line width difference can be obtained with excellent accuracy by executing the predetermined etching through the masks of the first resist pattern utilizing pattern contraction resulting from ion implantation and the second resist pattern not utilizing pattern contraction resulting from ion implantation.

According to a seventh aspect of the present invention, the step (f) includes a step of forming the second resist film on the overall surface of the etching object including the first pattern, and the first resist pattern is not substantially removed in execution of the step (g) due to composition change resulting from the ion implantation in the step (d).

In the method of manufacturing a semiconductor device according to the seventh aspect, the first resist pattern is not substantially removed in execution of the step (g) due to the composition change resulting from the ion implantation in the step (d), whereby formation of the second resist film in the step (f) can be executed through simplest full formation.

According to an eighth aspect of the present invention, the ion implantation in the step (d) includes ion implantation performed obliquely from above with respect to a vertical line a surface formed with the first resist pattern.

In the method of manufacturing a semiconductor device according to the eight aspect, the ion implantation in the step (d) is performed obliquely from above with respect to the vertical line on the surface formed with the first resist pattern for preventing ion implantation into the etching object also by side surfaces of the first resist pattern, so that ions are hardly implanted into the etching object under the first resist pattern. Thus, the etching object can be prevented from inconvenient ion implantation.

According to a ninth aspect of the present invention, the
etching object has asperities on its surface, and the
method further comprises a step (h) of performing ion
implantation into the etching object before executing
the step (b).

In the method of manufacturing a semiconductor device according to the ninth aspect, the asperities on the surface of the etching object is relaxed by the ion implantation in the step (d), whereby bad influence exerted by the asperities can be suppressed.

According to a tenth aspect of the present invention, the step (b) includes a step of performing exposure on the first resist film through a reticle of a predetermined pattern and thereafter executing development thereby obtaining the first resist pattern.

In the method of manufacturing a semiconductor device according to the tenth aspect, the asperities on the surface of the etching object is relaxed by the ion implantation in the step (d), whereby bad influence exerted by reflection from the asperities through the exposure in the step (b) can be suppressed.

According to an eleventh aspect of the present invention, the etching object has a mark for mask alignment on its surface.

In the method of manufacturing a semiconductor device according to the eleventh aspect, the etching object has the mark for mask alignment on its surface. While measuring accuracy of this mark is deteriorated due to the asperities on the surface, the asperities is relaxed by the ion implantation in the step (h) and hence the mask alignment accuracy can be improved following improvement in the measuring accuracy of the mark.

According to a twelfth aspect of the present invention, the step (h) includes steps of (h-1) forming a third resist film on the etching object, (h-2) patterning the third resist film to obtain a third resist pattern, the third resist pattern having an opening on a mark forming region including the mark, and (h-3) performing ion implantation into the mark forming region of the etching object using the third resist pattern as a mask.

In the method of manufacturing a semiconductor device according to the twelfth aspect, ions are implanted into the mark forming region of the etching object through the mask of the third resist pattern in the step (h-3) and the asperities on the surface of the mark forming region is relaxed due to the ion implantation in the step (h), whereby mask alignment accuracy can be improved following improvement in measuring accuracy of the mark.

Further, the third resist pattern can reliably prevent ion implantation into the etching object other than the mark forming region.

According to a thirteenth aspect of the present invention, the ion implantation in the step (d) includes a plurality of partial ion implantation operations different in implantation energy from each other.

In the method of manufacturing a semiconductor device according to the thirteenth aspect, a plurality of partial ion implantation operations different in implantation energy from each other are so performed as to homogeneously harden the first resist pattern along the thickness, whereby the predetermined etching in the step (e) can be executed without damaging the first resist pattern.

According to a fourteenth aspect of the present invention, a method of manufacturing a semiconductor device comprises steps of (a) forming an etching object on a semiconductor substrate, (b) forming a first resist film on the etching object, (c) patterning the first resist film to obtain a first resist pattern, (d) performing chemical reaction acceleration for accelerating decomposition on the first resist pattern, (e) performing curing including one of ion implantation, electron beam irradiation and ultraviolet irradiation on the first resist pattern, the thickness of the first resist pattern contracting by the curing in the step (e), and (f) executing predetermined etching on the etching object using the first resist pattern as a mask to obtain a work pattern after execution of the steps (c) to (e).

In the method of manufacturing a semiconductor device according to the fourteenth aspect, the first resist pattern contracts in thickness due to the curing executed in the step (e), whereby the work pattern can be obtained in excellent dimensional accuracy through the step (f).

In addition, decomposition of the first resist pattern is accelerated due to the chemical reaction acceleration in the step (d), whereby inconvenience resulting from generation of gas in the first resist pattern can be reliably avoided in execution of the step (f).

According to a fifteenth aspect of the present invention, the etching object includes first and second work areas, the first resist pattern includes a pattern for an etching mask for the first work area, the method further includes steps of (g) forming a second resist film at least on the second work area after execution of the step (e) and (h) patterning the second resist film to obtain a second resist pattern for an etching mask for the second work area, and the step (f) includes a step of executing the predetermined etching using the second resist pattern as a mask in addition to the first resist pattern.

In the method of manufacturing a semiconductor device according to the fifteenth aspect, work patterns different in line width from each other can be precisely obtained by executing predetermined etching through the masks of the first resist pattern utilizing contraction of the thickness and the pattern dimension resulting from curing and the second resist pattern not utilizing contraction of the thickness and the pattern dimension resulting from curing.

According to a sixteenth aspect of the present invention, the method of manufacturing a semiconductor device further comprises steps of (i) performing chemical reaction acceleration for accelerating decomposition at least on the second resist pattern before the step (f) and after the step (h), and (j) performing the curing at least on the second resist pattern before the step (f) and after the step (h).

In the method of manufacturing a semiconductor device according to the sixteenth aspect, etching resistance of the second resist pattern against the predetermined etching can be improved by the curing in the step (j). When the curing in the step (j) is so performed as to hardly contract the thickness of the second resist pattern, the pattern dimension of the second resist pattern can be maintained.

In addition, decomposition of the first and second resist patterns is accelerated due to the chemical reaction acceleration in the steps (d) and (i), whereby inconvenience caused by generation of gas in the first and second resist patterns can be reliably avoided in execution of the step (f).

According to a seventeenth aspect of the present invention, the chemical reaction acceleration includes at least either exposure or heat treatment on the etching object.

In the method of manufacturing a semiconductor device according to the seventeenth aspect, decomposition in the first or second resist pattern can be accelerated by performing exposure and heat treatment on the first or second resist pattern employed as the object.

According to an eighteenth aspect of the present invention, a method of manufacturing a semiconductor device comprises steps of (a) forming an etching object having first and second work areas on a semiconductor substrate, (b) forming a first resist film on the etching object, (c) patterning the first resist film to obtain a first resist pattern on the first work area, (d) performing curing including one of ion implantation, electron beam irradiation and ultraviolet irradiation on the first resist pattern, the thickness of the first resist pattern contacting by the curing in the step (d), (e) forming a second resist film at least on the second work area after execution of the step (d), (f) patterning the second resist film to obtain a second resist pattern for an etching mask for the second work area and (g) executing predetermined etching on the etching object using the first and second resist patterns as masks to obtain a work pattern.

In the method of manufacturing a semiconductor device according to the eighteenth aspect, work patterns different in line width from each other can be precisely obtained by executing the predetermined etching through the masks of the first resist pattern utilizing contraction of the thickness and the pattern dimension resulting from the curing in the step (d) and the second resist pattern not utilizing contraction of the thickness and the pattern dimension resulting from the curing.

An object of the present invention is to provide a method of manufacturing a semiconductor device capable of suppressing critical dimension shift density difference in etching without hindering the etching.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 1 to 4 are sectional views showing a wiring pattern forming method defining the principle of an embodiment 1 of the present invention;

FIG. 12 is a graph showing space width dependency;

FIG. 13 is an explanatory diagram showing the shape of a developed resist pattern;

FIG. 14 is an explanatory diagram showing the shape of the resist pattern after ion implantation;

FIGS. 15 to 20 are sectional views showing a wiring pattern forming method according to an embodiment 2 of the present invention;

FIGS. 21 to 27 are sectional views showing a wiring pattern forming method according to an embodiment 3 of the present invention;

FIGS. 36 to 40 are sectional views showing a wiring pattern forming method according to an embodiment 5 of the present invention;

FIG. 44 is an explanatory diagram typically showing a surface shape of an aluminum film formed by sputtering with heating;

FIG. 45 is an explanatory diagram typically showing a surface shape obtained after implanting ions into the aluminum film formed by sputtering with heating;

DESCRIPTION OF THE PREFERRED EMBODIMENTS

Embodiment 1

Principle

Figure 5:
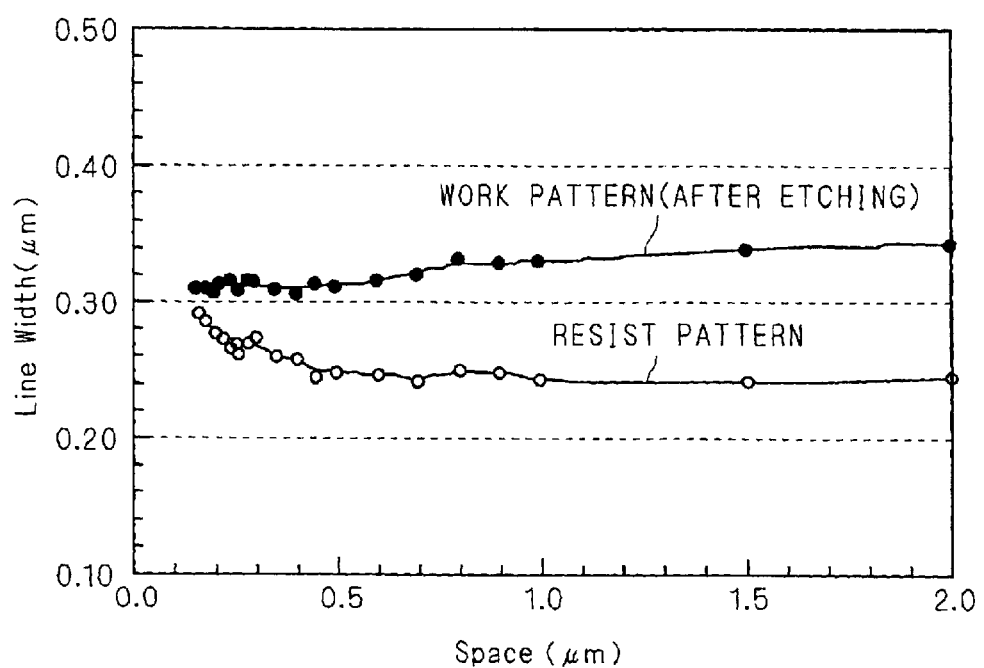
FIG. 5 is a graph showing results of comparison of pattern sizes of a resist pattern and an etched work pattern.

In relation to a method of suppressing critical dimension shift density difference resulting from etching of an insulator film, the inventors have made deep study to recognize that the critical dimension shift density difference of the insulator film is reduced as the thickness of a resist pattern is reduced. Accordingly, it is desirable to form a resist pattern having the minimum thickness required as a mask for dry etching.

FIGS. 1 to 4 are sectional views showing a wiring pattern forming method defining the principle of the present invention. The method of forming a wiring pattern is now described with reference to FIGS. 1 to 4.

First, a polysilicon layer 2 is formed on a silicon substrate 1 in a thickness of 50 nm (500 Å), then a silicon nitride film 3 is formed in a thickness of 165 nm (1650 Å), and thereafter a photoresist film 4 is applied onto the silicon nitride film 3 and prebaked at 100° C. for 90 seconds. At this time, the revolution speed in application is so adjusted that the thickness of the photoresist film 4 is 445 nm (4450 Å).

Then, exposure is performed with a stepper having a KrF excimer laser 6 as a light source through a reticle 5 on which wiring patterns are drawn at various pitches, as shown in FIG. 2. Off-axis illumination employing a ⅔ annular illumination aperture is applied under an illumination condition of NA =0.55.

Then, post-exposure baking (PEB) is performed at 110° C. for 90 seconds, and thereafter development is performed for 60 seconds with an aqueous solution of 2.38 percent by weight of tetramethylammonium hydroxide (TMAH), thereby obtaining a resist pattern 4a responsive to the reticle 5 as shown in FIG. 3.

Then, the resist pattern 4a is employed as a mask for etching the nitride film 3 and the polysilicon layer 2 by parallel plate RIE with a gas mixture of $CHF_3$, $CF_4$, Ar and $O_2$, thereby obtaining a desired wiring pattern (polysilicon pattern 2a and silicon nitride pattern 3a) shown in FIG. 4.

The aforementioned method is similar to the conventional pattern forming method shown in FIGS. 48 to 51, except the thickness of the photoresist film 4.

FIG. 5 is a graph showing results of comparison of pattern sizes of the resist pattern 4a and a work pattern (multilayer structure of the polysilicon layer 2 and the silicon nitride film 3) after etching, formed by the wiring pattern forming method shown in FIGS. 1 to 4. FIG. 5 plots sizes (Line Width) of the resist pattern 4a and the work pattern subjected to etching, with reference to a line width of 0.24 μm, with respect to space widths (Space) respectively.

Figure 6:
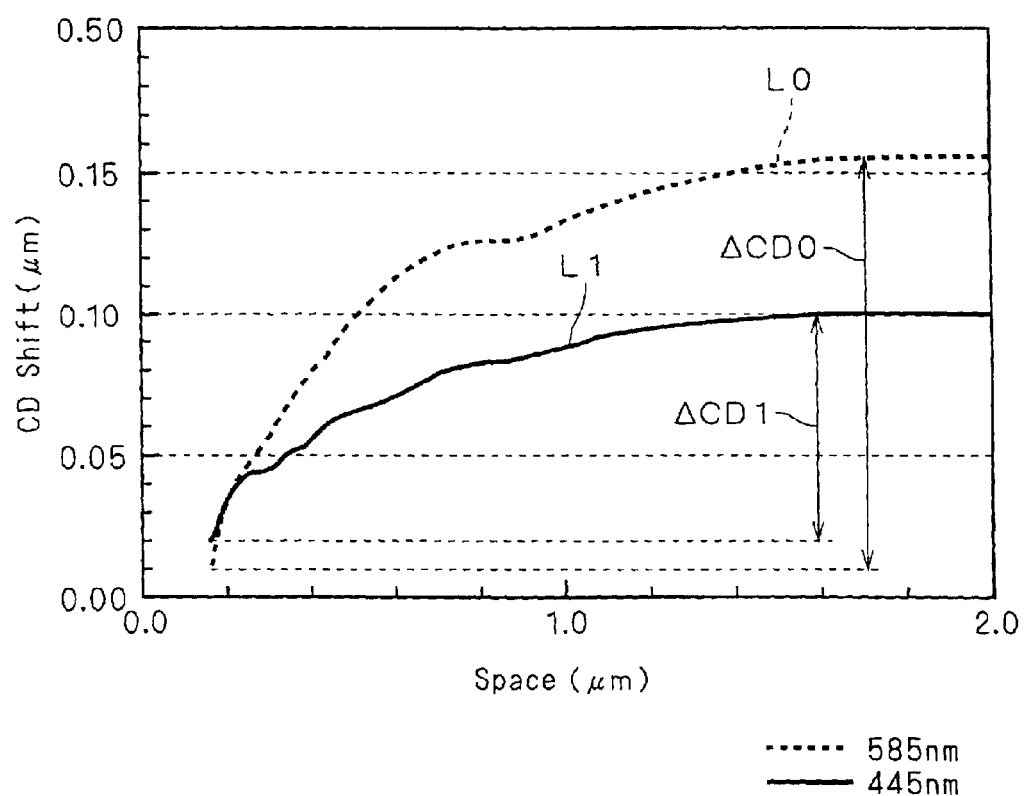
FIG. 6 is a graph showing space width dependency.

FIG. 6 is a graph showing space width dependency based on FIG. 5. This graph shows dependency of the critical dimension shift (CD Shift) in etching at the line width of 0.24 μm on the space width of an adjacent region.

Referring to FIG. 6, symbol L0 shows such a case that the thickness of the resist pattern 4a is 585 nm, and symbol L1 shows such a case that the thickness of the resist pattern 4a is 445 nm. As shown in FIG. 6, it is understood that critical dimension shift density difference ΔCD1 of 0.079 μm between a densest pattern and an isolated line pattern having a sufficiently wide space in the case where the thickness of the resist pattern 4a is 445 nm is dramatically reduced as compared with the critical dimension shift density difference ΔCD0 of 0.141 μm in the prior art having the resist pattern 4a of 585 nm in thickness.

Table 1 shows sizes (resist sizes) of resist patterns for obtaining isolated lines having line widths of 0.40 μm, 0.35 μm and 0.30 μm respectively and depths of focus (DOF) in formation of the resist patterns of the respective Etching CD Shift (0.14, 0.08, 0.06 and 0 (μm)).

TABLE 1

Unit: μm

| Fin-ished Size | Etching CD Shift | | | | | | | |
|---|---|---|---|---|---|---|---|---|
| | 0.14 | | 0.08 | | 0.06 | | 0 | |
| | Resist Size | DOF | Resist Size | DOF | Resist Size | DOF | Resist Size | DOF |
| 0.40 | 0.26 | 0.64 | 0.32 | 0.78 | 0.34 | 0.83 | 0.40 | 0.98 |
| 0.35 | 0.21 | 0.62 | 0.27 | 0.65 | 0.29 | 0.70 | 0.35 | 0.86 |
| 0.30 | 0.16 | 0.33 | 0.22 | 0.62 | 0.24 | 0.63 | 0.30 | 0.72 |

In order to obtain a work pattern having a finished line width of 0.30 μm after etching, for example, a resist pattern having a resist size of 0.16 μm is necessary in the process (critical dimension shift density difference: about 0.14 μm) with the resist film thickness of 585 nm and the depth of focus for obtaining this is 0.33 μm.

In order to similarly obtain a work pattern having a finished line width of 0.30 μm after etching, a resist pattern of 0.22 μm is necessary in the process (critical dimension shift density difference: about 0.08 μm) with the resist film thickness of 445 nm and the depth of focus for obtaining this is 0.62 μm, indicating that a small resist film thickness reducing a critical dimension shift is advantageous.

When a depth of focus required for a finished size of 0.30 μm is at least 0.60, therefore, the critical dimension shift density difference must be not more than 0.08 μm from Table 1, and assuming that this "0.08 μm" is a predetermined reference value, the critical dimension shift density difference of 0.079 μm of the resist pattern having the thickness of 445 nm is below the predetermined reference value.

While a resist pattern having a thickness of 370 nm was also tried, shoulder drop of a resist pattern took place during dry etching and it has been recognized that the thickness of the resist pattern is insufficient for serving as an etching mask.

From these results, it has been proved that there is an optimum resist film thickness minimizing space width dependency (critical dimension shift density difference) of the critical dimension shift in etching, and it is effective to reduce the thickness of the resist film in a range causing no hindrance as an etching mask.

Method

FIGS. 7 to 11 are sectional views showing a wiring pattern forming method according to an embodiment 1 of the present invention. The procedure of the embodiment 1 is now described with reference to FIGS. 7 to 11.

Figure 7:
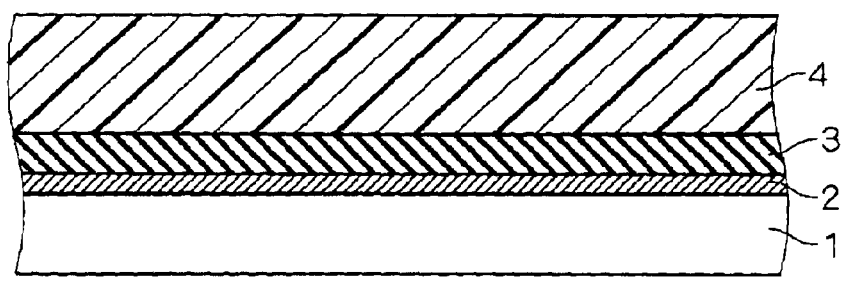
FIGS. 7 to 11 are sectional views showing a wiring pattern forming method according to the embodiment 1 of the present invention.
Figure 8:
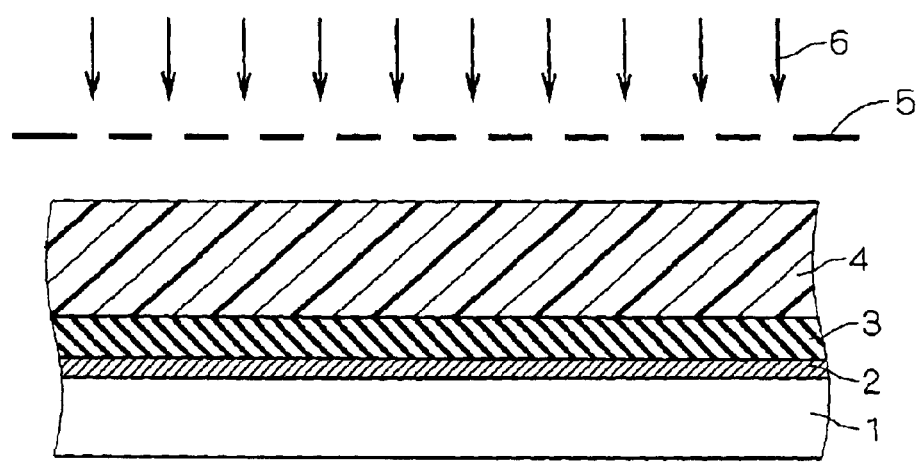
Figure 9:
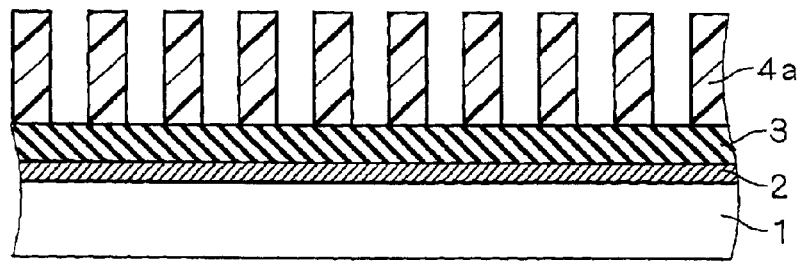

Steps shown in FIGS. 7 to 9 are carried out similarly to those shown in FIGS. 1 to 3.

Figure 10:
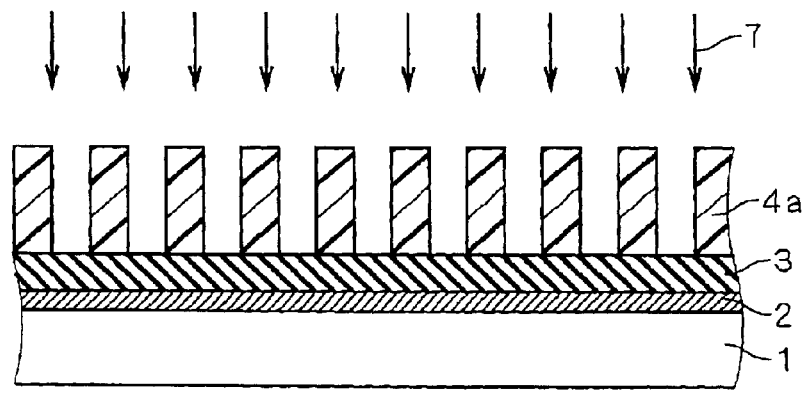

As shown in FIG. 10, ions 7 are implanted into a resist pattern 4a. In this case, argon is employed as the ion species for performing ion implantation under 50 keV at $1 \times 10^{16}/cm^2$. Due to this ion implantation, the thickness of the resist pattern 4a contracts to about 334 nm, i.e., about 75% of 445 nm, while the resist pattern 4a causes composition change thereby improving resistance against etching for a silicon nitride film 3 and a polysilicon layer 2.

Figure 11:
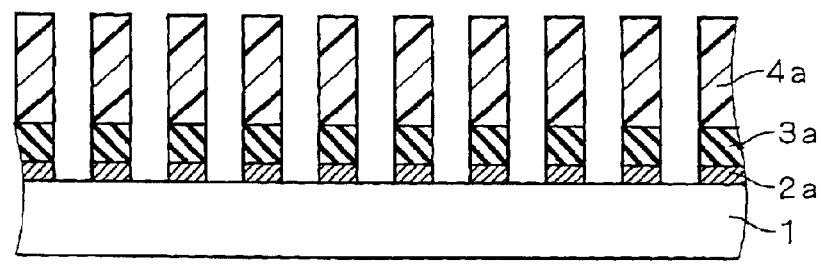
Figure 18:
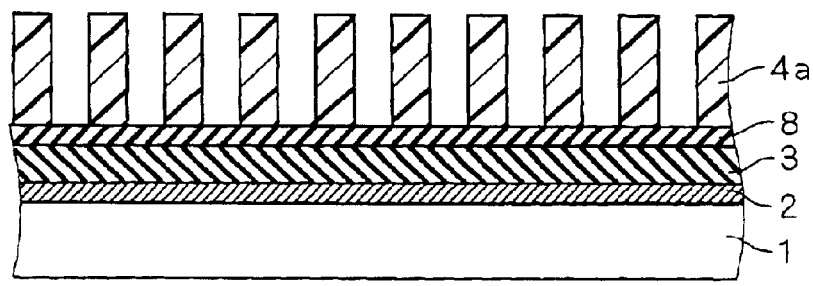

Then, the resist pattern 4a is employed as a mask for etching the nitride film 3 and the polysilicon layer 2 by parallel plate RIE with a gas mixture of $CHF_3$, $CF_4$, Ar and $O_2$, thereby obtaining a desired wiring pattern (polysilicon pattern 2a and silicon nitride pattern 3a) shown in FIG. 11.

At this time, the resist pattern 4a, improved in resistance against etching for the silicon nitride film 3 and the polysilicon layer 2 due to the ion implantation, functions as an etching mask with no hindrance also when its thickness is about 334 nm.

As one of conditions for causing no hindrance to etching, there is such a condition that vertical portions (with respect to a surface formed with an etching object) of the resist pattern 4a do not disappear during etching, i.e., the resist pattern 4a causes no shoulder drop.

Figure 54:
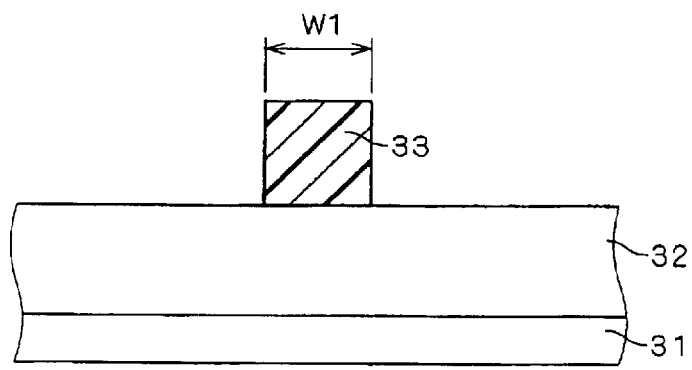
FIGS. 54 to 56 are sectional views for illustrating shoulder drop of a resist pattern.
Figure 55:
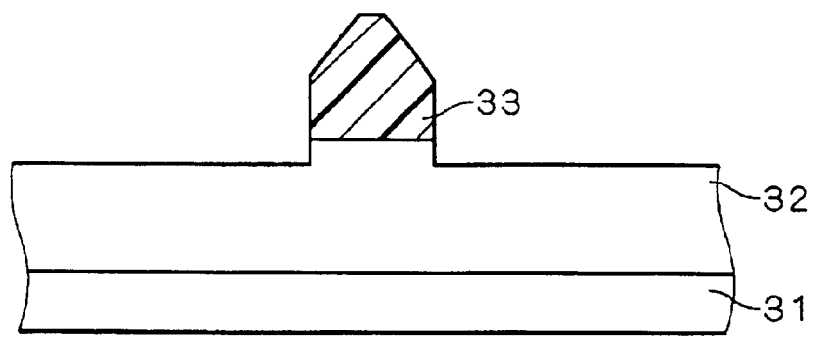
Figure 56:
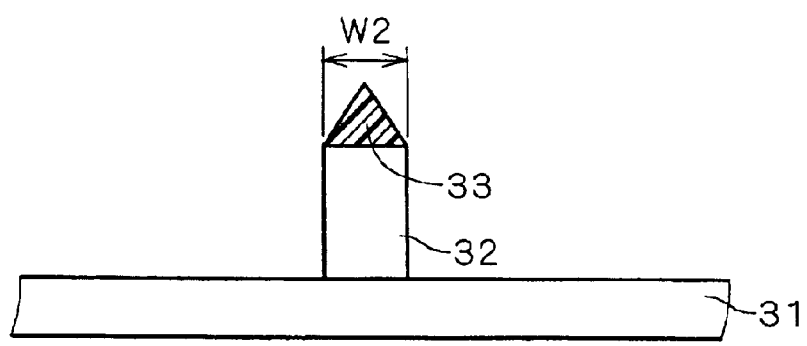

FIGS. 54 to 56 are sectional views for illustrating a shoulder drop phenomenon of a resist pattern. When performing etching on an etching object 32 formed on an underlayer substrate 31 with a resist pattern 33, insufficient in thickness, having a pattern width W1 as shown in FIG. 54, both shoulder portions (edge portions) of the resist pattern 33 are scraped off in the process of the etching as shown in FIG. 55, to result in shoulder drop with disappearance of the vertical portions as shown in FIG. 56. When performing etching in the state causing shoulder drop, it follows that the resist pattern 33 serves as a mask with a pattern width W2 smaller than the pattern width W1, to unstabilize the finished size of the etching object 32.

However, the resist pattern 4a subjected to ion implantation is improved in etching resistance to cause no shoulder drop during the etching process also when its thickness is 334 nm. Therefore, the resist pattern 4a having the thickness of 334 nm satisfies the condition of causing no hindrance to etching.

FIG. 12 is a graph showing space width dependency. This graph shows dependency of critical dimension shifts in work patterns (multilayer structures of polysilicon layers and silicon nitride films) in etching of line patterns of 0.24 $\mu$m with respect to space widths of adjacent regions.

Referring to FIG. 12, symbol L0 shows the case of a resist pattern having a thickness of 585 nm, symbol L1 shows the case of a resist pattern having a thickness of 445 nm, and symbol L2 shows the case of a resist pattern, subjected to ion implantation, having a thickness of 334 nm.

As shown in FIG. 12, the density difference between a densest pattern and an isolated line pattern having a sufficiently wide space is 0.059 $\mu$m in the resist pattern having the thickness 334 nm, and it has been proved that the critical dimension shift density difference is further reduced.

In the wiring pattern forming method according to the embodiment 1, as hereinabove described, the thickness of the resist pattern 4a is suppressed below the predetermined reference value remarkably improving the critical dimension shift density difference as compared with the prior art and set to the thickness (334 nm) satisfying the condition of causing no hindrance to etching for the polysilicon layer 2 and the silicon nitride film 3 through the ion implantation step shown in FIG. 10, whereby the wiring pattern can be obtained in high dimensional accuracy through etching employing the resist pattern 4a shown in FIG. 11 as a mask also when the wiring pattern has relatively large density difference.

When the depth of focus required for a finished size of 0.35 $\mu$m is at least 0.70 in Table 1, the critical dimension shift density difference must be not more than 0.06 $\mu$m from Table 1, and assuming that this "0.06 $\mu$m" is a predetermined reference value, the critical dimension shift density difference of 0.059 $\mu$m of the resist pattern having the thickness of 334 nm is below the predetermined reference value.

Another Effect by Ion Implantation

While roughness (irregularity) is observed on edges 4e in the resist pattern 4a after development as shown in FIG. 13, the roughness of the edges 4e is relaxed and the resist pattern 4a can attain excellent linearity as shown in FIG. 14 when performing ion implantation with the ion species of argon under conditions of 50 keV and $1 \times 10^{16}/cm^2$.

Such roughness of the edges comes to deteriorate dimensional accuracy along progress of pattern refinement, and it has been possible to attain an effect of improving dimensional accuracy of the resist pattern 4a by performing ion implantation.

Embodiment 2

FIGS. 15 to 20 are sectional views showing a wiring pattern forming method according to an embodiment 2 of the present invention. The procedure of the embodiment 2 is now described with reference to FIGS. 15 to 20.

First, a polysilicon layer 2 is formed on a silicon substrate 1 in a thickness of 50 nm, then a silicon nitride film 3 is formed in a thickness of 165 nm, and thereafter a silicon oxynitride (SiON) film 8 of 24.5 nm in thickness is formed by plasma CVD, as shown in FIG. 15. Due to the plasma CVD, the silicon oxynitride film 6 is not influenced by a step of the underlayer but formed in a uniform thickness.

Thereafter a photoresist film 4 is applied onto the silicon oxynitride film 8, for obtaining a resist pattern 4a subjected to ion implantation through a flow similar to that of the steps in the embodiment 1 shown in FIGS. 7 to 10, as shown in FIGS. 16 to 19.

Figure 19:
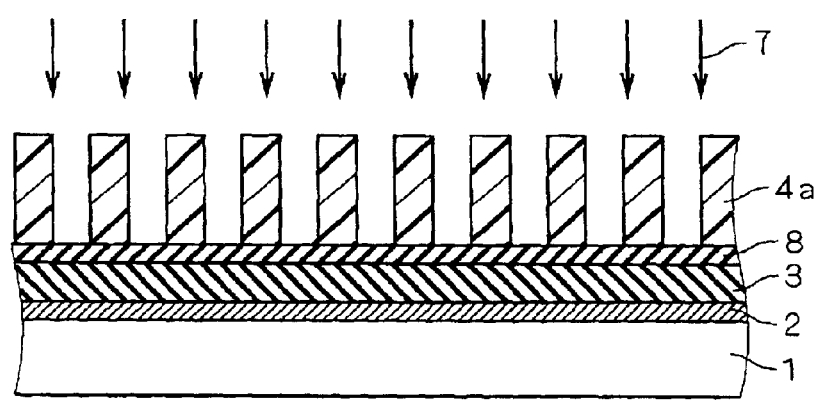

The silicon oxynitride film 8, serving as an antireflection coating (BARC: bottom anti-reflective coating) in exposure (step shown in FIG. 17), also serves as a protective film (ion prevention film) preventing implantation of ions into an actual etching object (the polysilicon layer 2) present under the silicon oxynitride film 8 in ion implantation (step shown in FIG. 19). The silicon nitride film 3 itself also has a function serving as an ion prevention film, and hence the silicon oxynitride film 8 for serving as an ion prevention film is not necessary when the silicon nitride film 3 has a thickness sufficient for preventing ions.

Figure 20:
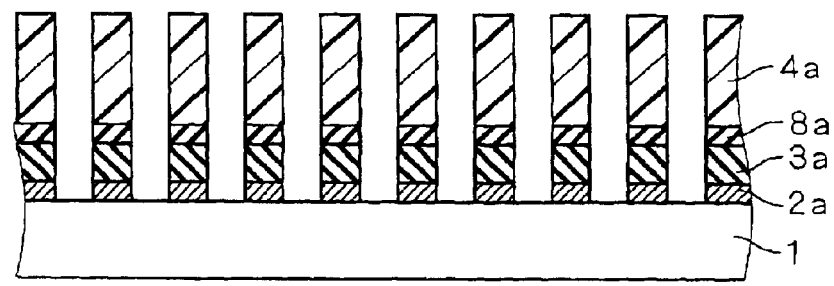
Figure 24:
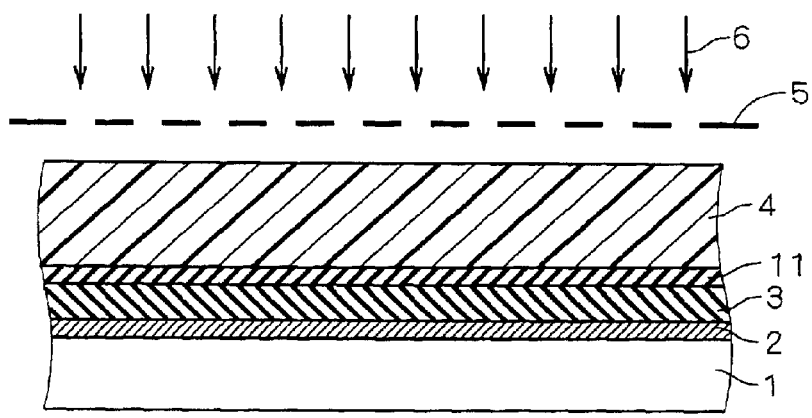
Figure 25:
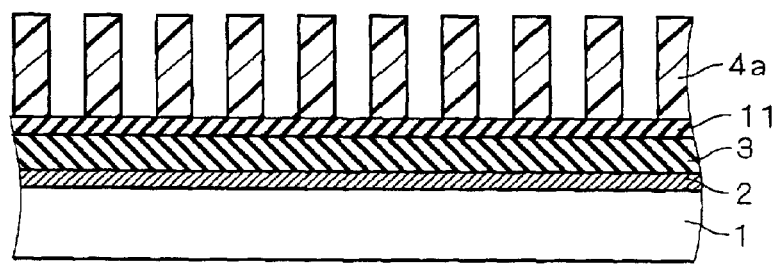

Finally, the resist pattern 4a is employed as a mask for etching the nitride film 3 and the polysilicon layer 2 by parallel plate RIE with a gas mixture of $CHF_3$, $CF_4$, Ar and $O_2$, thereby obtaining a desired wiring pattern (polysilicon pattern 2a, silicon nitride pattern 3a and silicon oxynitride pattern 8a) shown in FIG. 20.

In place of the silicon oxynitride film 8 formed in the step shown in FIG. 15, an organic BARC film may be formed in a thickness of 80 nm for thereafter applying a resist film and forming a wiring pattern through steps similar to those shown in FIGS. 16 to 20. The organic BARC film also serves as a protective film (ion prevention film) against ion implantation into the actual etching object, similarly to the silicon oxynitride film 8.

The organic BARC film has such a property that the same is thinly formed above the step of the underlayer and thickly formed under the step. When applying the organic BARC film so that the underlayer is 80 nm in thickness on a flat portion, for example, the film is formed only in a thickness of 20 nm above the step while formed in a thickness of 100 nm under the step, to disadvantageously result in thickness difference of 80 nm between the portions located above and under the step.

When employing the organic BARC film, the thickness of the organic BARC film contracts in the ion implantation step shown in FIG. 19, while such contraction of the thickness takes place at a constant rate. Assuming that the thickness contracts by 50%, for example, the thickness of the portion above the step contracts to 10 nm and that of the portion under the step contracts to 50 nm, thereby reducing the thickness difference to 40 nm.

When an actual device having a local step is formed on a silicon substrate 1, therefore, the thickness difference of the organic BARC film is reduced on the step portion, and an effect of reducing unevenness of the critical dimension shift in etching resulting from unevenness of the thickness of the organic BARC film can be attained by ion implantation.

Embodiment 3

FIGS. 21 to 27 are sectional views showing a wiring pattern forming method according to an embodiment 3 of the present invention. The procedure of the embodiment 3 is now described with reference to FIGS. 21 to 27.

First, a polysilicon layer 2 is formed on a silicon substrate 1 in a thickness of 50 nm, then a silicon nitride film 3 is formed in a thickness of 165 nm, and thereafter an organic BARC film 11 is formed on the silicon nitride film 3 in a thickness of 80 nm, as shown in FIG. 21.

Then, ion implantation is performed from above the organic BARC film 11, as shown in FIG. 22. At this time, the thickness of the organic BARC film 11 contracts to effectively reduce unevenness of the thickness of the organic BARC film 11 on a step portion of a device formed on the silicon substrate 1.

Figure 26:
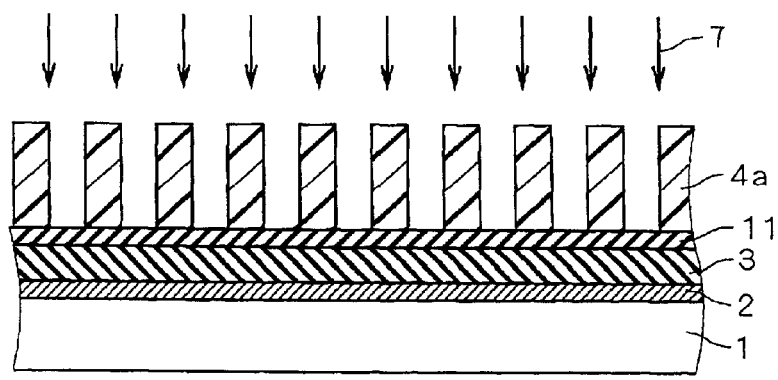
Figure 27:
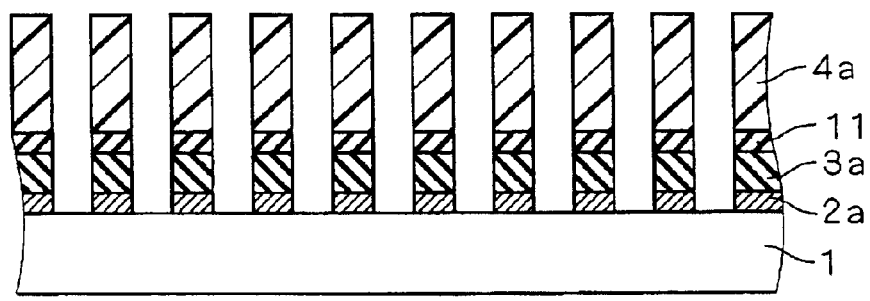

Then, a wiring pattern (polysilicon pattern 2a, silicon nitride pattern 3a and organic BARC pattern 11a) is formed through a flow similar to that of the steps in the embodiment 1 shown in FIGS. 7 to 11, as shown in FIGS. 23 to 27. When performing ion implantation into the formed resist pattern 4a again as shown in FIG. 26, this effectively functions for improving dry etching resistance of the resist pattern 4a and reduction of critical dimension shift density difference in etching following contraction of the thickness of the resist pattern 4a.

Embodiment 4

FIGS. 28 to 35 are sectional views showing a wiring pattern forming method according to an embodiment 4 of the present invention. Referring to FIGS. 28 to 35, a pattern forming method of forming patterns having difficulty in simultaneous formation through two photolithography steps is applied to bit lines of a DRAM, for example. These steps require formation of a thin line pattern of not more than 0.1 $\mu$m in a memory cell part and formation of a space pattern of not more than 0.20 $\mu$m in a peripheral circuit part. The procedure of the embodiment 4 is now described with reference to FIGS. 28 to 35.

Figure 28:
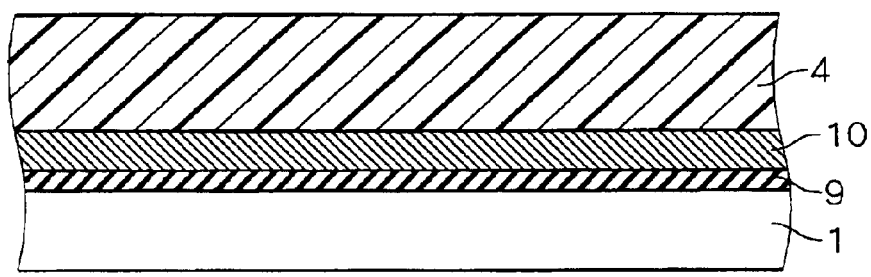
FIGS. 28 to 35 are sectional views showing a wiring pattern forming method according to an embodiment 4 of the present invention.

First, a silicon oxide film 9 is formed on a silicon substrate 1 followed by formation of a metal wire 10 for wires, and thereafter a photoresist film 4 is applied onto the metal film 10 and prebaked at 100° C. for 60 seconds, as shown in FIG. 28. At this time, the revolution speed in application is so adjusted that the thickness of the photoresist film 4 is 585 nm.

Figure 29:
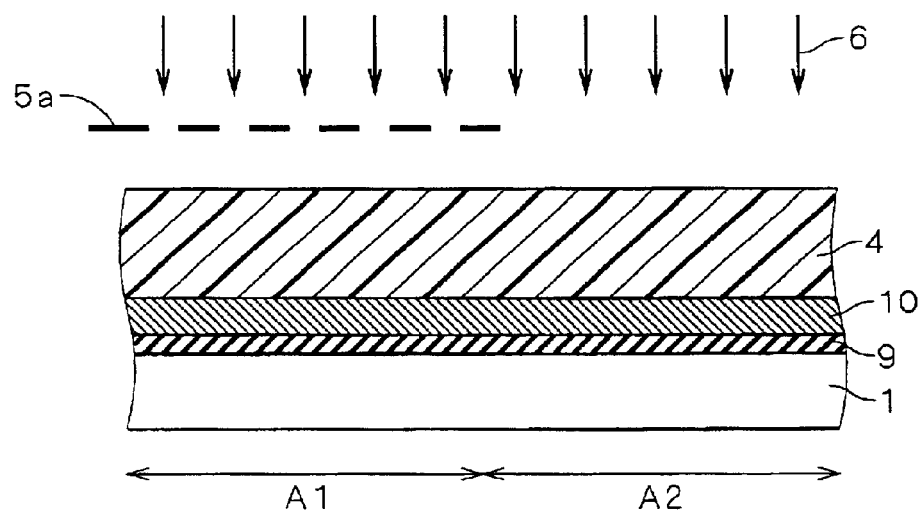

Then, exposure is performed with a stepper having a KrF excimer laser (wavelength: 248 nm) as a light source through a reticle (photomask) 5a on which a wiring pattern (L (line width)/S (space width)=0.16 $\mu$m/0.22 $\mu$m) for a memory cell forming region A1 is drawn, as shown in FIG. 29. Off-axis illumination employing a ⅔ annular illumination aperture is applied under an illumination condition of NA =0.55.

Figure 30:
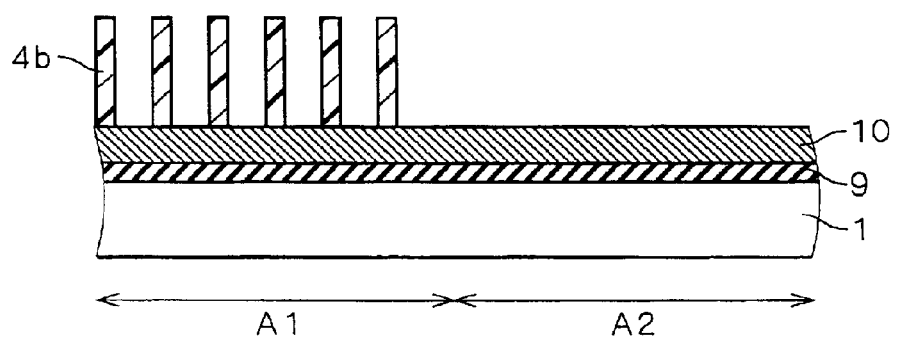

Then, post-exposure baking (PEB) is performed at 110° C. for 60 seconds, and thereafter development is performed for 60 seconds with an aqueous solution of 2.38 percent by weight of tetramethylammonium hydroxide (TMAH), thereby obtaining a resist pattern 4b having a line width of 0.13 $\mu$m, as shown in FIG. 30.

Before applying the photoresist film 4, an inorganic BARC film (silicon oxynitride film 8) or an organic BARC film may be formed on the metal film 10 as an antireflection coating, similarly to the embodiment 2 or 3.

Figure 31:
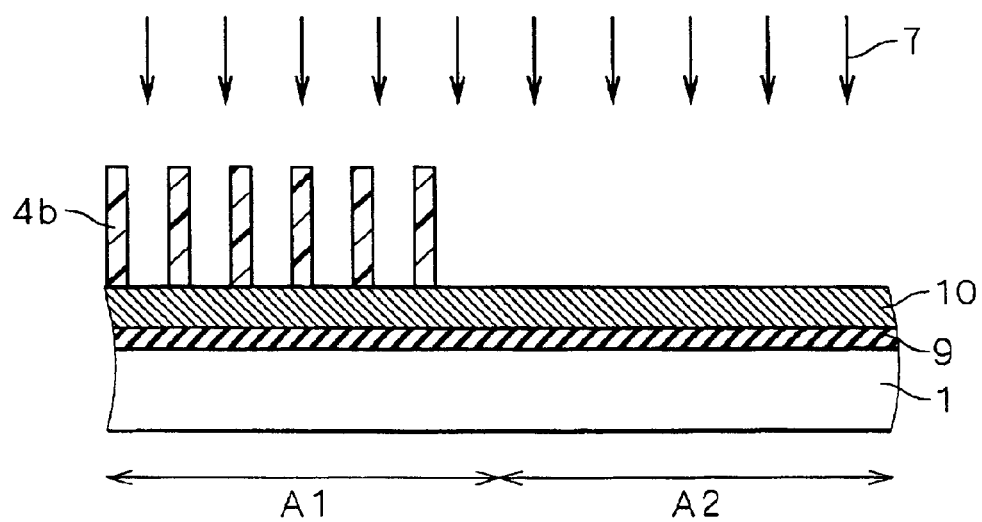

Then, ions are implanted into the resist pattern 4b with the ion species of argon under conditions of 50 keV and $1\times10^{16}/\text{cm}^2$, as shown in FIG. 31.

Such ion implantation into the resist pattern 4b results in pattern contraction as described in Japanese Patent Application Laid-Open No. 4-127518 (1992), and the line width of 0.13 $\mu$m of the resist pattern 4b contracts to 0.10 $\mu$m. Under the same illumination condition and resist process condition, it is extremely difficult to obtain a line pattern of 0.10 $\mu$m due to narrow process tolerance such as exposure tolerance or focus tolerance and a small width leading to fall of the resist pattern. To this end, a pattern of a thin line can be obtained beyond a limit in a general pattern forming method by performing ion implantation into the resist pattern and utilizing pattern contraction.

The composition of the resist pattern 4b changes due to the ion implantation.

When forming a resist pattern for a peripheral circuit region A2 at the same time in the exposure step shown in FIG. 29, a space portion of the pattern of the peripheral circuit region A2 undesirably spreads in ion implantation to the contrary. It is extremely difficult to obtain a pattern in a desired size since a resist pattern for the peripheral circuit region A2 having a narrow space must be previously formed through the exposure step shown in FIG. 29.

Figure 32:
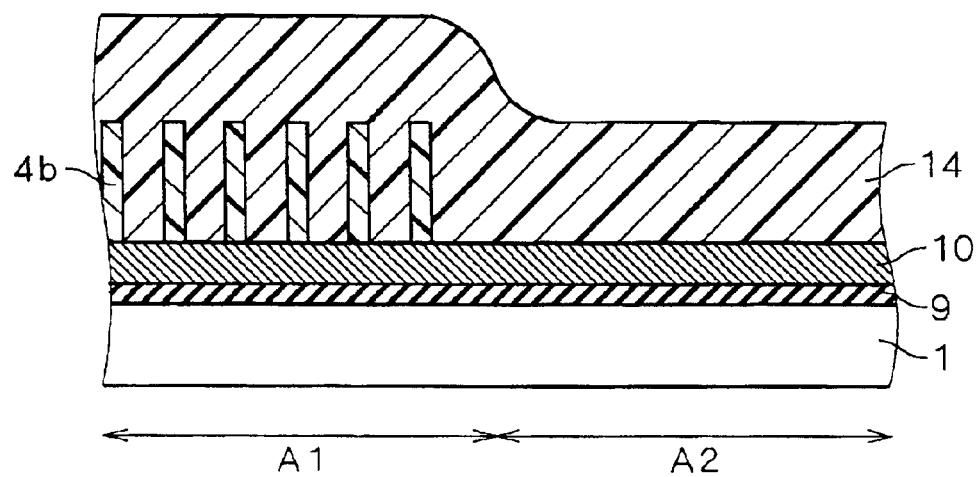

After obtaining the resist pattern 4b through the step shown in FIG. 31, therefore, a photoresist film 14 is applied to/formed on the overall surface of the metal film 10 including the memory cell region A1 and the peripheral circuit region A2, as shown in FIG. 32. In other words, another photoresist film 14 is formed on the resist pattern 4b of the memory cell region A1. The photoresist film 14 is applied under conditions identical to those for the first photoresist film 4.

Figure 33:
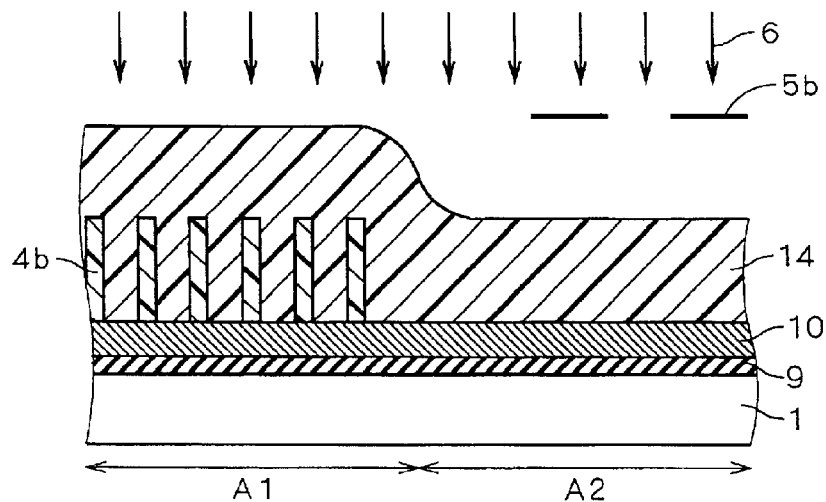

Then, exposure is performed with a stepper having a KrF excimer laser (wavelength: 248 $\mu$m) 6 as a light source through a reticle (photomask) 5b drawn in correspondence to the peripheral circuit region A2 excluding the memory cell region A1, as shown in FIG. 33. Off-axis illumination employing a ⅔ annular illumination aperture is applied under an illumination condition of NA=0.55. Development is performed under conditions identical to those for the first layer, for forming the pattern 4b for the peripheral circuit region A2.

Figure 34:
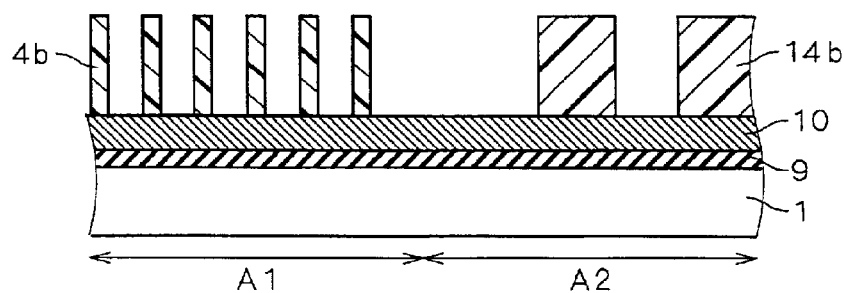

Then, post-exposure baking (PEB) is performed at 110° C. for 60 seconds, and thereafter development is performed for 60 seconds with an aqueous solution of 2.38 percent by weight of tetramethylammonium hydroxide (TMAH) thereby obtaining a resist pattern 14b having a line width of 0.50 μm and a space width of 0.2 μm, as shown in FIG. 34.

The composition of the resist pattern 4b is converted to be absolutely different from that of the photoresist film 14 due to the ion implantation, and hence the resist pattern 4b is neither influenced by the exposure through the step shown in FIG. 33 nor removed by the development through the step shown in FIG. 34 but correctly reproduced.

Figure 35:
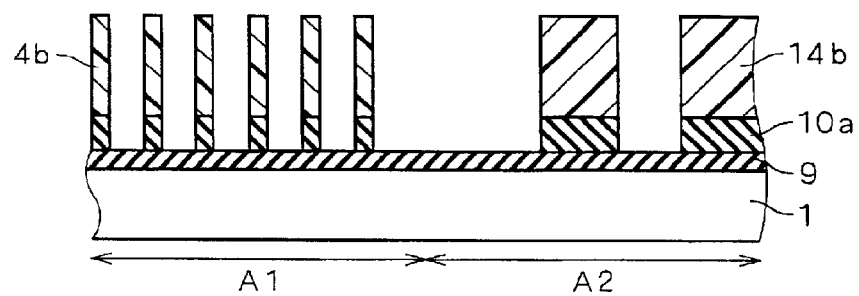

The metal film 10 is etched through masks of the resist patterns 4b and 14 c, thereby obtaining a desired wiring pattern (metal pattern 10a), as shown in FIG. 35.

According to the method of the embodiment 4, it is possible to form the resist pattern 4a having a line width smaller than the mask size on the memory cell pattern of the memory cell region A1 on which a pattern is drawn at a constant pitch as well as the resist pattern 14b on the peripheral circuit region A2 with no deterioration accuracy, thereby forming a wiring pattern varied in line width difference in high accuracy.

Embodiment 5

FIGS. 36 to 40 and FIG. 42 are sectional views showing a wiring pattern forming method according to an embodiment 5 of the present invention. FIG. 41 is an explanatory diagram showing a reticle on which a pattern is drawn through a capacitor forming step for a DRAM. The prerequisite for the embodiment 5 is that capacitor formation of the DRAM is performed. The procedure of the embodiment 5 is now described with reference to these figures.

First, a polysilicon layer 2 and a silicon oxide film 13 are formed on a silicon substrate 1 in thicknesses of 50 nm and 1500 nm respectively, and thereafter a photoresist film 4 is applied onto the silicon oxide film 13 and prebaked at 100° C. for 60 seconds, as shown in FIG. 36. At this time, the revolution speed in application is so adjusted that the thickness of the photoresist film 4 is 880 nm.

Then, exposure is performed with a stepper having a KrF excimer laser (wavelength: 248 nm) 6 as a light source through a reticle (photomask) 5m (see FIG. 41) on which the pattern in the capacitor formation step for the DRAM is drawn, as shown in FIG. 37. Off-axis illumination employing a ⅔ annular illumination aperture is applied under an illumination condition of NA=0.55.

Then, post-exposure baking (PEB) is performed at 110° C. for 90 seconds and thereafter development is performed for 60 seconds with an aqueous solution of 2.38 percent by weight of tetramethylammonium hydroxide (TMAH), thereby obtaining a resist pattern 4m for a capacitor responsive to the reticle 5m, as shown in FIG. 38.

Figure 42:
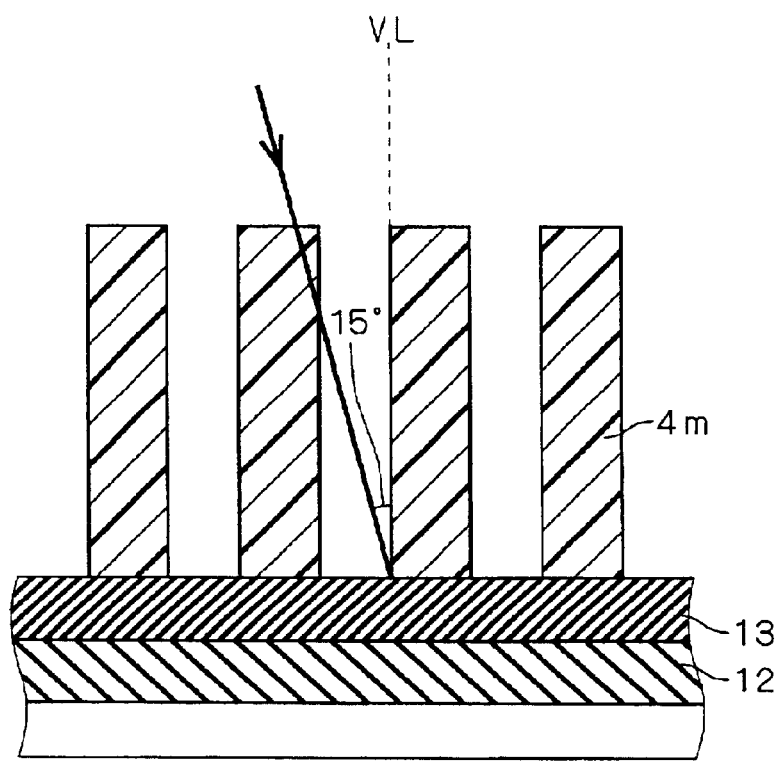
FIG. 42 is a sectional view showing a characteristic part of the wiring pattern forming method according to the embodiment 5.

Then, ions 7 are implanted into the resist pattern 4m with the ion species of argon under conditions of 50 keV and $1\times10^{16}/cm^2$, as shown in FIG. 39. At this time, ion implantation is performed from a direction inclined by 15 to 20° from a vertical line VL on a wafer (surface formed with the resist pattern 4m), as shown in FIG. 42. Due to this method, most part of the ions 7 are blocked by the surface and side surfaces of the resist pattern 4m as shown in FIG. 42, whereby the ions 7 can be inhibited from direct implantation into the silicon oxide film 13 serving as an underlayer substrate. An optimum angle of inclination in implantation of the ions 7 varies with the line width, the pitch (line width+space width) and the thickness of the resist pattern 4m, and hence proper adjustment is necessary as the case may be.

The resist pattern 4m obtained after development causes pattern contraction due to the ion implantation, and the line width of a remaining portion of resist is reduced from 0.17 μm to 0.11 μm.

Figure 40:
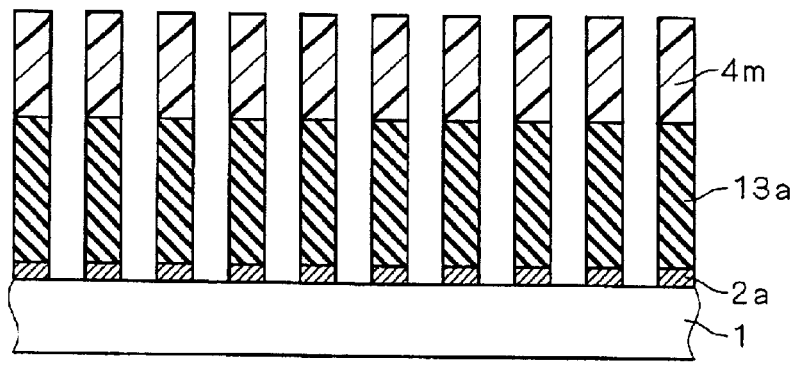
Figure 41:
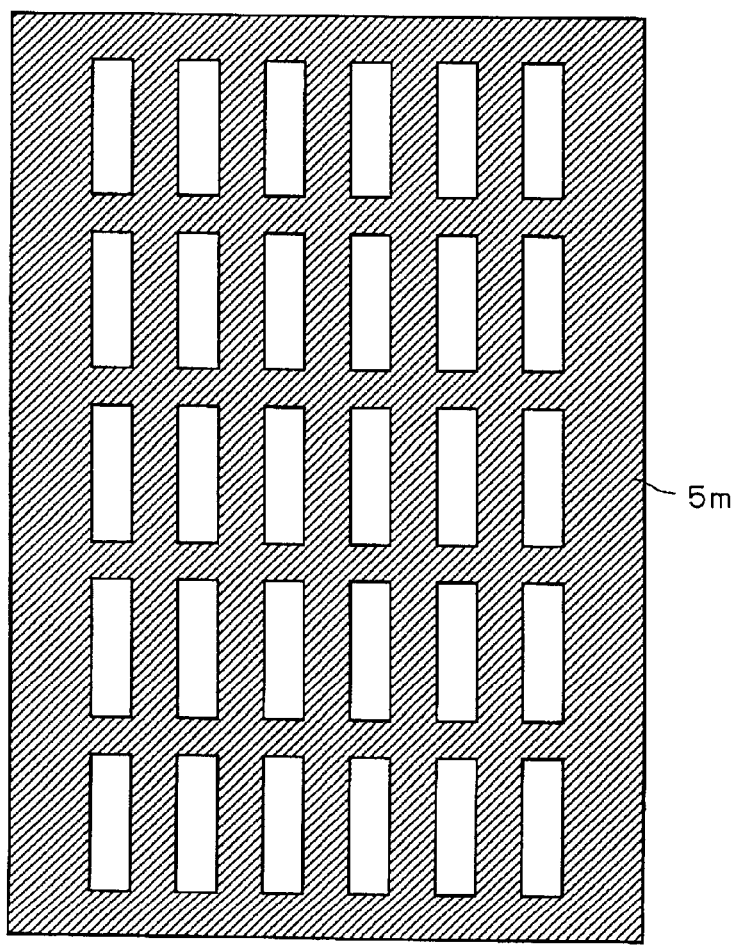
FIG. 41 is an explanatory diagram showing a reticle on which a pattern in a capacitor forming step for a DRAM is drawn.

The silicon oxide film 13 and the polysilicon layer 2 are etched through a mask of the resist pattern 4m, thereby obtaining a wiring pattern (oxide film pattern 13a and polysilicon pattern 2a), as shown in FIG. 40.

It is desirable to form a large opening pattern in the capacitor forming step for the DRAM in order to attain a large capacitance, and it is possible to effectively enlarge the space width following contraction of the line width by applying this method.

Also in a self-aligned contact hole forming method for the DRAM, a similar effect can be attained by applying this method in order to form a large opening pattern.

Embodiment 6

A surface of aluminum or tungsten is remarkably irregularized due to grains, to exert no small influence on formation of a resist pattern.

Particularly when forming an aluminum layer by sputtering, an embedding property in a contact hole formed for connection with an underlayer is required while the embedding property is reduced as the contact hole size is reduced. While there is a method of sputtering aluminum and thereafter making reflow by heating or sputtering a substrate while heating the same as a method of improving the embedding property, the grain size exceeds that of an aluminum film formed by general sputtering in either case. When forming a resist pattern on an underlayer substrate consisting of such an aluminum layer, therefore, the resist pattern shape is deteriorated due to influence by light reflected by the grains, to result in reduction of dimensional uniformity of the resist pattern.

Figure 43:
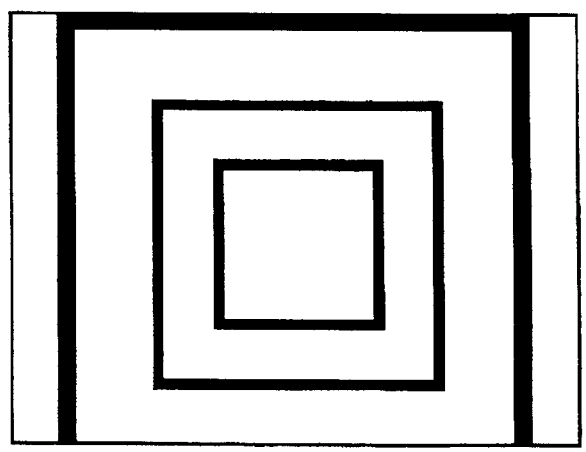
FIG. 43 is an explanatory diagram typically showing a surface shape of an aluminum film formed by general sputtering.

FIGS. 43 to 45 are explanatory diagrams typically showing states of grains on various aluminum surfaces. FIGS. 43 and 44 are explanatory diagrams showing surface shapes of an aluminum film formed by general sputtering and an aluminum film formed by sputtering with heating respectively. When implanting ions 7 into an underlayer substrate with the ion species of argon under conditions of 50 keV and $1\times10^{16}/cm^2$ before application of resist, therefore, asperities on the substrate surface caused by grains is relaxed, as shown in FIG. 45. A wiring pattern forming method according to an embodiment 6 of the present invention aims at relaxing such asperities.

Figure 46:
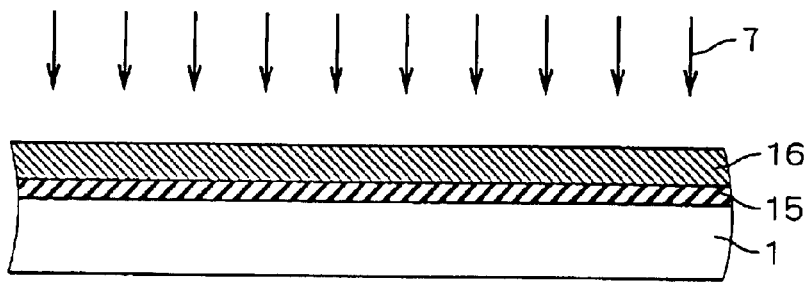
FIG. 46 is a sectional view showing a characteristic part of a wiring pattern forming method according to an embodiment 6 of the present invention.

FIG. 46 is a sectional view showing a characteristic part of the wiring pattern forming method according to the embodiment 6 of the present invention.

Ions 7 are implanted into an underlayer substrate consisting of a multilayer structure of a silicon substrate 1, a silicon oxide film 15 and an aluminum layer 16 with the ion species of argon under conditions of 50 keV and $1\times10^{16}/cm^2$, as shown in FIG. 46. Thereafter a wiring pattern is formed through a general flow similar to that shown in FIGS. 1 to 4 with reference to the embodiment 1.

In the wiring pattern forming method according to the embodiment 6, the aluminum layer 16 having grains on its surface is previously subjected to ion implantation, whereby shape deterioration of a resist pattern resulting from influence by light reflected from the grains of the aluminum layer 16 can be suppressed when forming the resist pattern, and an effect of improving the dimensional accuracy of the resist pattern can be attained.

Embodiment 7

As hereinabove described, a surface of tungsten or aluminum is remarkably irregularized due to grains, and hence alignment accuracy in an exposure stage or measurement accuracy in an alignment test after pattern formation is also deteriorated when forming a resist pattern on such an underlayer substrate. When making measurement with alignment test marks (four central square portions) shown in FIGS. 43 to 45, for example, measurement accuracy (3σ) is about 20 nm in a general aluminum film (see FIG. 43) while measurement accuracy (3σ) is deteriorated to about 100 nm in an aluminum film (FIG. 44) obtained by sputtering while performing heating.

When performing ion implantation on an underlayer substrate with the ion species of argon under conditions of 50 keV and $1\times10^{16}/cm^2$ before applying resist, irregularity caused by grains on the substrate surface is relaxed as shown in FIG. 45, and hence deterioration of alignment accuracy can be suppressed and the measuring accuracy (3σ) can be improved up to about 50 nm.

Figure 47:
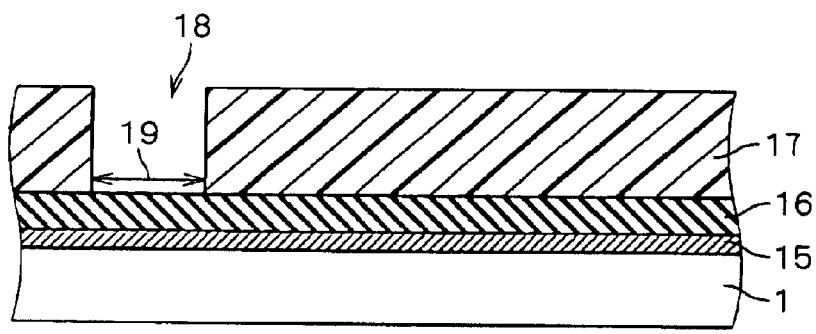
FIG. 47 is a sectional view showing a characteristic part of a wiring pattern forming method according to an embodiment 7 of the present invention.
Figure 48:
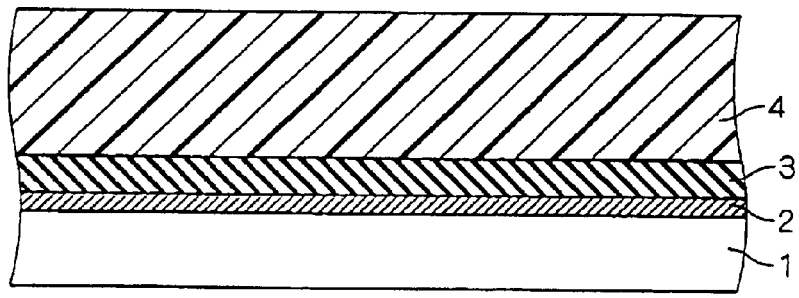
FIGS. 48 to 51 are sectional views showing a conventional pattern forming method.
Figure 49:
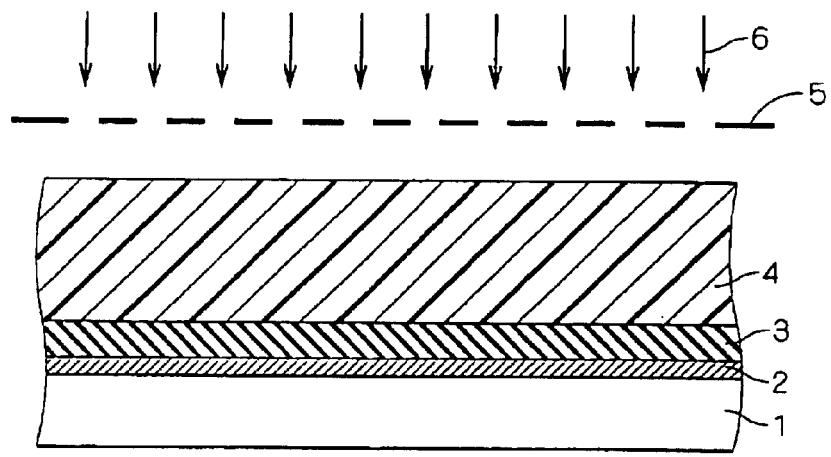
Figure 50:
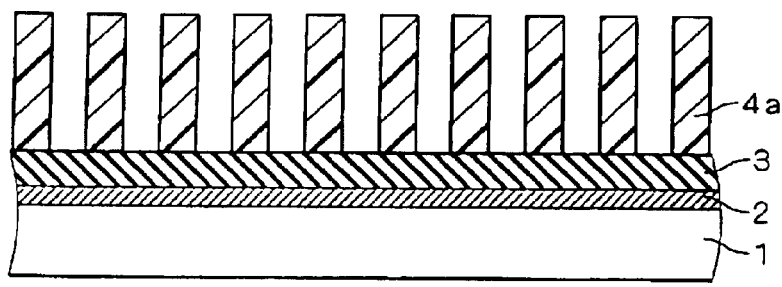
Figure 51:
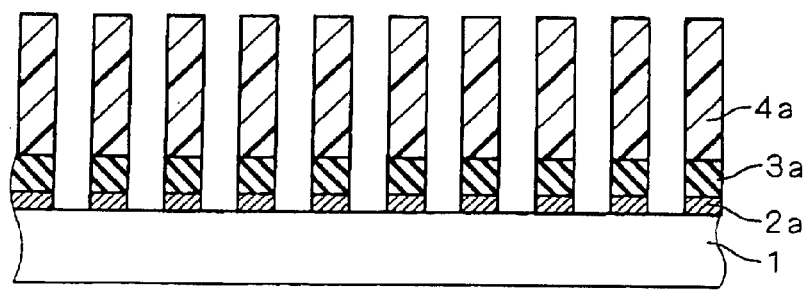
Figure 52:
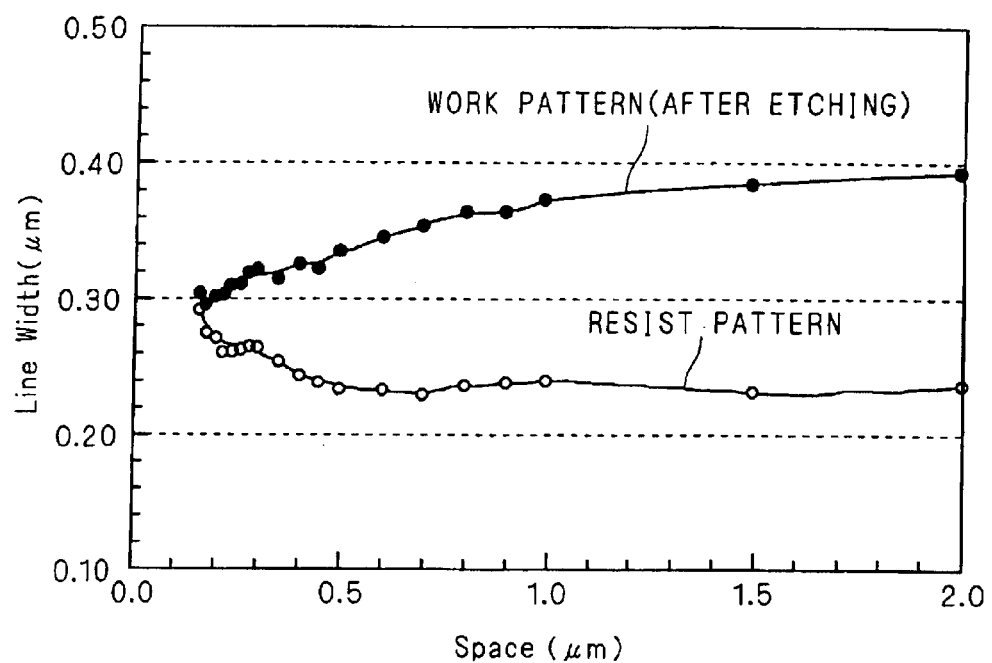
FIG. 52 is a graph showing results of comparison of pattern sizes of a resist pattern and a work pattern obtained after etching.
Figure 53:
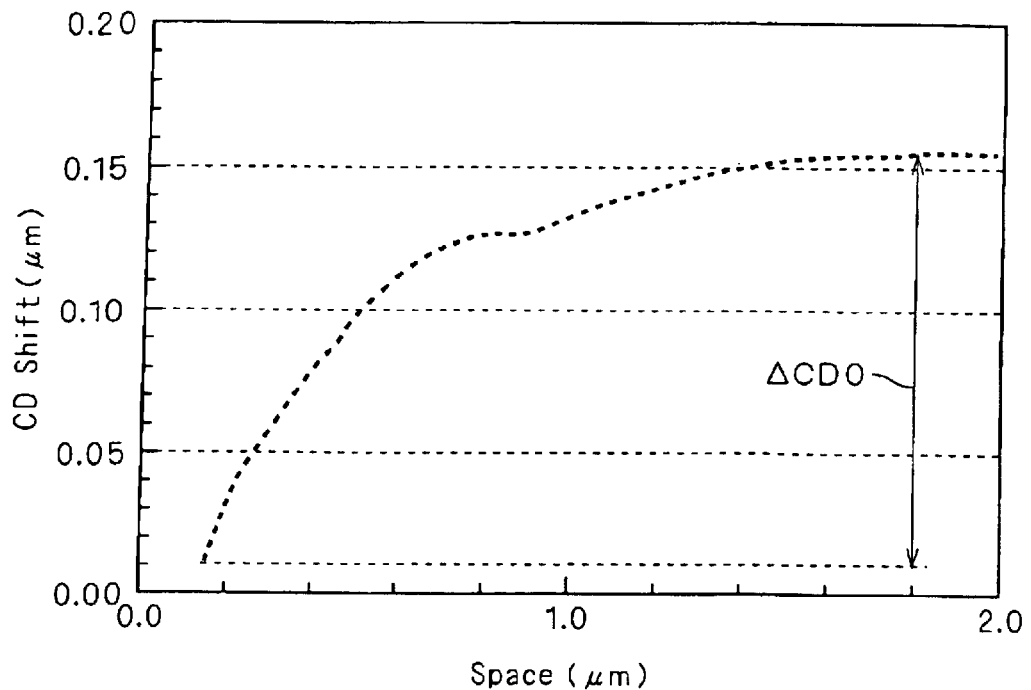
FIG. 53 is a graph showing space width dependency.

FIG. 47 is a sectional view showing a characteristic part of a wiring pattern forming method according to an embodiment 7 of the present invention.

As shown in FIG. 47, a resist pattern 17 having an opening 18 only on a mark forming region 19 including an inspection mark (not shown) of an aluminum layer 16 is formed on an underlayer substrate consisting of a multilayer structure of a silicon substrate 1, a silicon oxide film 15 and the aluminum layer 16 by photolithography or the like, and ions 7 are implanted only into the mark forming region 19 of the aluminum layer 16 through a mask of the resist pattern 17. Thereafter a wiring pattern is formed through a general flow similar to that shown in FIGS. 1 to 4 with reference to the embodiment 1.

Thus, according to the embodiment 7, ion implantation is performed through the resist pattern 17 having the opening 18 only on the mark forming region 19 formed with a mark for alignment and alignment inspection after working a film of tungsten or aluminum when the underlayer substrate is made of tungsten or aluminum.

Consequently, it is effective as a method of preventing deterioration of alignment accuracy in a next photolithography step by reducing the number of grains in the mark portion. Further, the resist pattern 17 reliably protects regions other than the mark forming region not to be badly influenced by ion implantation.

Embodiment 8

Premise

FIGS. 57 to 61 are sectional views showing gate pattern forming steps included in a wiring pattern forming method defining the premise of an embodiment 8 of the present invention. The procedure of the gate pattern forming steps is now described with reference to FIGS. 57 to 61.

Figure 57:
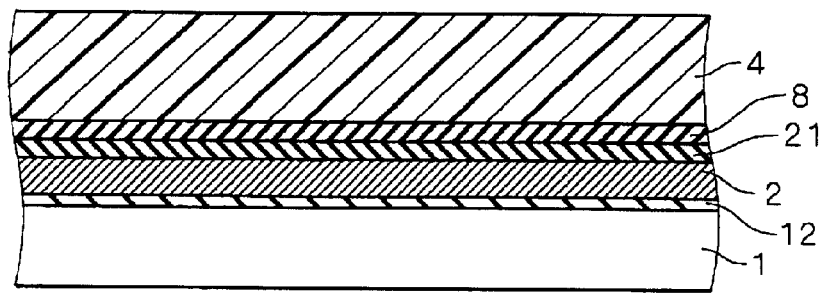
FIGS. 57 to 61 are sectional views showing gate pattern forming steps defining the premise of an embodiment 8 of the present invention.

As shown in FIG. 57, a silicon oxide film 12, a polysilicon layer 2, a silicon oxide film 21 and a silicon oxynitride film 8 are formed on a silicon substrate 1 in thicknesses of 15 nm (150 Å), 100 nm (1000 Å), 50 nm (500 Å) and 48 nm (480 Å) respectively, and thereafter a photoresist film 4 is applied onto the silicon oxynitride film 8 and prebaked at 100° C. for 90 seconds. In this case, the revolution speed in application is so adjusted that the thickness of the photoresist film 4 is 585 nm (5850 Å).

Figure 58:
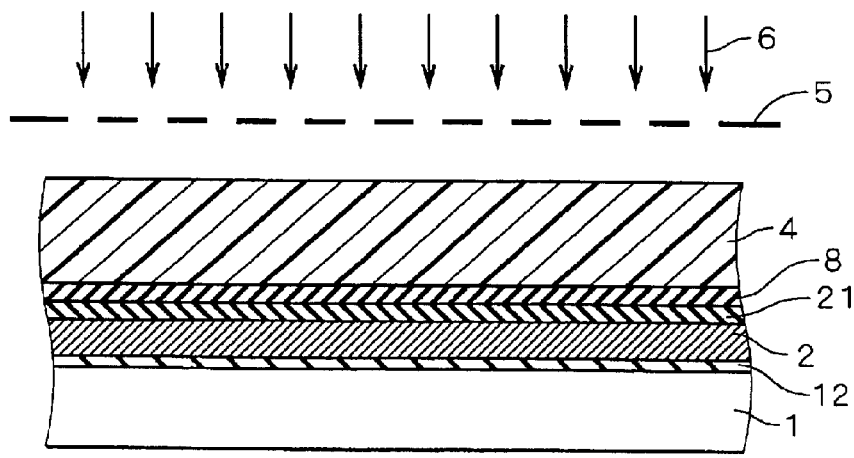

Then, exposure is performed with a stepper having a KrF excimer laser 6 as a light source through a reticle 5 on which a wiring pattern is drawn, as shown in FIG. 58. Off-axis illumination employing a ⅔ annular illumination aperture is applied under an illumination condition of NA=0.65.

Figure 59:
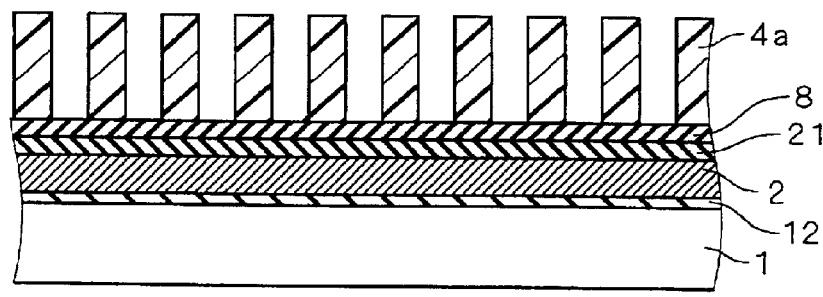

Then, post-exposure baking (PEB) is performed at 110° C. for 90 seconds and thereafter development is performed for 60 seconds with an aqueous solution of 2.38 percent by weight of tetramethylammonium hydroxide (TMAH), thereby obtaining a resist pattern 4a responsive to the reticle 5 as shown in FIG. 59.

Figure 60:
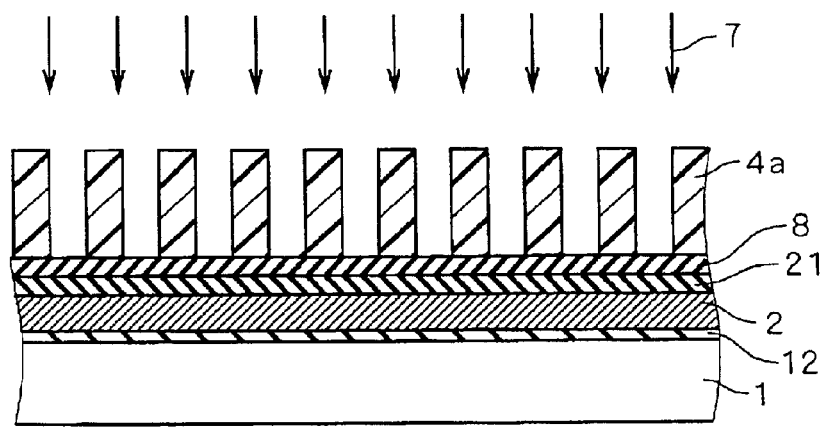

As shown in FIG. 60, ions 7 are implanted into the resist pattern 4a. In this case, argon is employed as the ion species for performing ion implantation under 50 keV (implantation energy) at $1\times10^{16}/cm^2$ (dose). Due to this ion implantation, the resist pattern 4a contracts in thickness as described above, and is improved in etching resistance against etching for the silicon oxide film 21 and the silicon oxynitride film 8.

Figure 61:
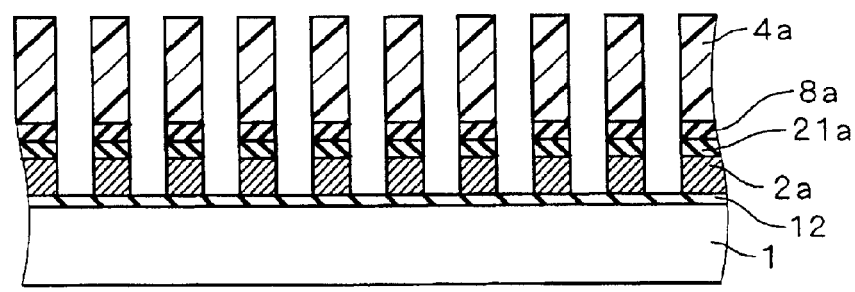

Then, the silicon oxynitride film 8 and the silicon oxide film 21 are etched through the resist pattern 4a serving as a mask, thereafter the resist pattern 4a is separated, and the polysilicon layer 2 is etched through the patterned silicon oxynitride film 8 and silicon oxide film 21 for obtaining a desired wiring pattern (polysilicon pattern 2a), as shown in FIG. 61. Alternatively, the silicon oxynitride film 8, the silicon oxide film 21 and the polysilicon layer 2 may be collectively etched through the mask of the resist pattern 4a.

At this time, the resist pattern 4a is improved in etching resistance against the etching for the silicon oxide film 21 and the silicon oxynitride film 8 due to the ion implantation, to serve as an etching mask with no hindrance even if the thickness thereof contracts in the step shown in FIG. 60.

When the resist pattern 4a is subjected to ion implantation, however, formation of a hardened layer is facilitated from the surface of the resist pattern 4a and hence gas generated from the resist pattern 4a may be confined in the resist pattern 4a during later dry etching for the silicon oxynitride film 8 and the silicon oxide film 21, disadvantageously leading to a possibility of rupturing the resist pattern 4a. Therefore, a process window forming an allowable range for process conditions satisfying the specification of dry etching is disadvantageously limited.

In general, chemical reaction takes place on a part of a positive photoresist film irradiated with light to release a reaction product. Novolac-quinonediazido resist widely employed for g and i rays generates nitrogen or chemically amplified resist employed for KrF generates carbon dioxide or a compound such as butene or ethanol in response to the structure of a protective group as a main product while generating decomposites of a remaining solvent and a polymer to conceivably generate gas.

Embodiments 8 to 12 of the present invention described below aim at solving the aforementioned problem of rupture of a photoresist film subjected to ion implantation caused by generation of gas.

Method

FIGS. 62 to 67 are sectional views showing gate pattern forming steps of a wiring pattern forming method according to the embodiment 8 of the present invention. The procedure of the embodiment 8 is now described with reference to FIGS. 62 to 67.

Figure 62:
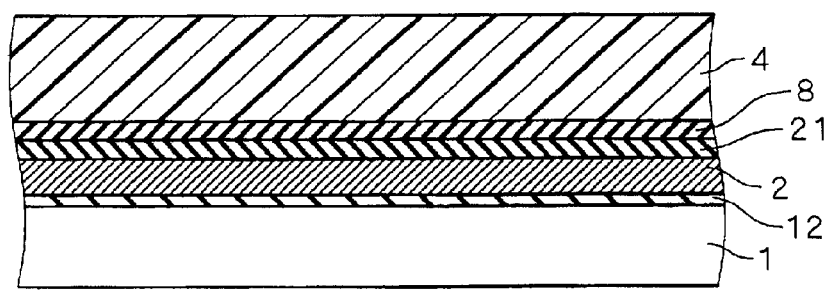
FIGS. 62 to 67 are sectional views showing gate pattern forming steps according to the embodiment 8.

First, a silicon oxide film 12, a polysilicon layer 2, a silicon oxide film 21 and a silicon oxynitride film 8 are formed on a silicon substrate 1 in thicknesses of 15 nm, 100 nm, 50 nm and 48 nm respectively as shown in FIG. 62, and thereafter a photoresist film 4 is applied onto the silicon oxynitride film 8 and thereafter prebaked at 100° C. At this time, the revolution speed in application is so adjusted that the thickness of the photoresist film 4 is 585 nm.

Figure 63:
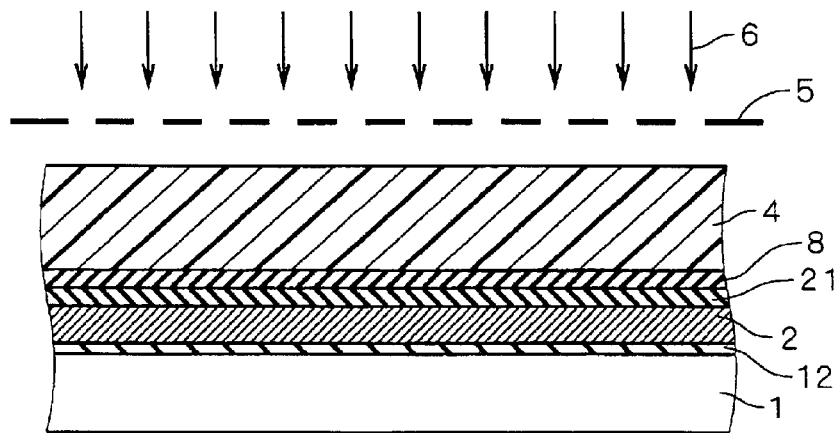

Then, exposure is performed with a stepper having a KrF excimer laser 6 as a light source through a reticle 5 on which a wiring pattern is drawn, as shown in FIG. 63. Off-axis illumination employing a ⅔ annular illumination aperture is applied under an illumination condition of NA =0.65.

Figure 64:
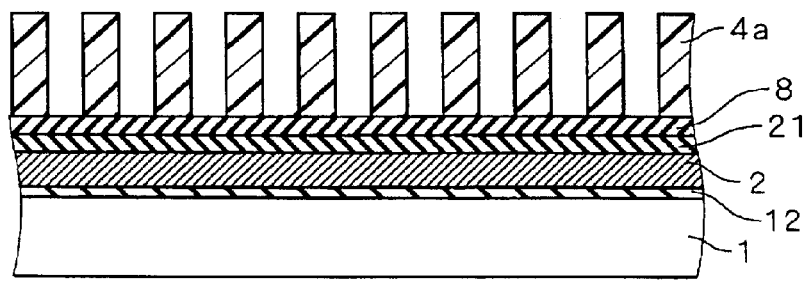

Then, post-exposure baking (PEB) is performed at 110° C. for 90 seconds and thereafter development is performed for 60 seconds with an aqueous solution of 2.38 percent by weight of tetramethylammonium hydroxide (TMAH), thereby obtaining a resist pattern 4a responsive to the reticle 5 as shown in FIG. 64.

Figure 65:
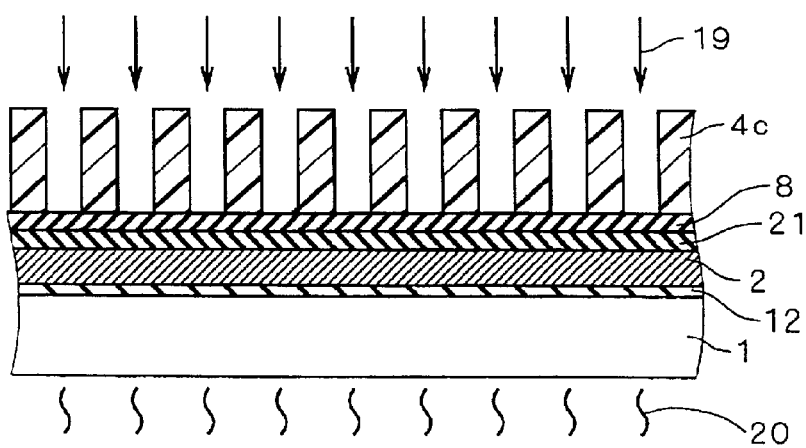

Then, exposure is performed on the resist pattern 4a with a stepper having a KrF excimer laser 19 as a light source and thereafter post-exposure baking is performed through a heat source 20 at 100° C. for 90 seconds for obtaining a resist pattern 4c, as shown in FIG. 65. The wavelength of the KrF excimer laser 19 is 248 nm.

The resist pattern 4a can be converted to the resist pattern 4c subjected to decomposition which is a kind of chemical reaction due to the exposure and heat treatment shown in FIG. 65.

Figure 66:
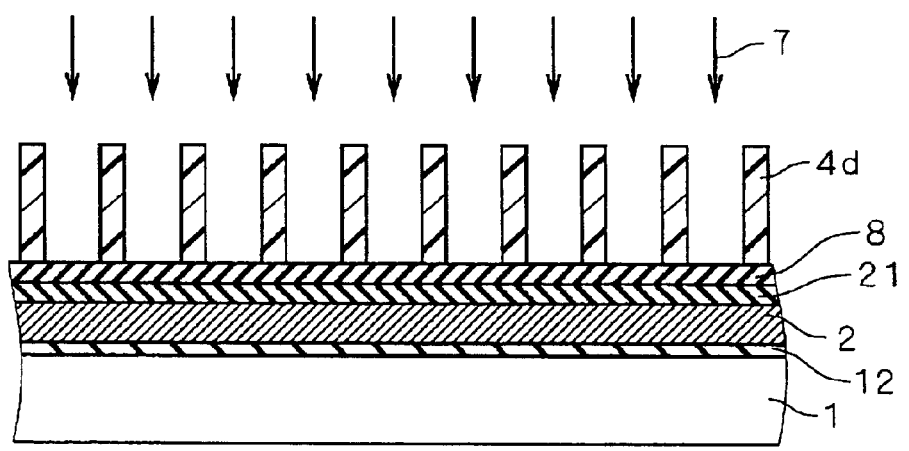

As shown in FIG. 66, ions 7 are implanted into the resist pattern 4c for obtaining a resist pattern 4d. In this case, argon is employed as the ion species for performing ion implantation under 50 keV at $1\times10^{16}/cm^2$. Due to this ion implantation, the thickness of the resist pattern 4d contracts from that of the resist pattern 4c as hereinabove described, while etching resistance is improved against etching for the silicon oxide film 21 and the silicon oxynitride film 8. For example, while the line width of the resist pattern 14c shown in FIG. 66 not yet subjected to ion implantation is 0.14 μm, that of the resist pattern 14d subjected to ion implantation is reduced to 0.10 μm.

Figure 67:
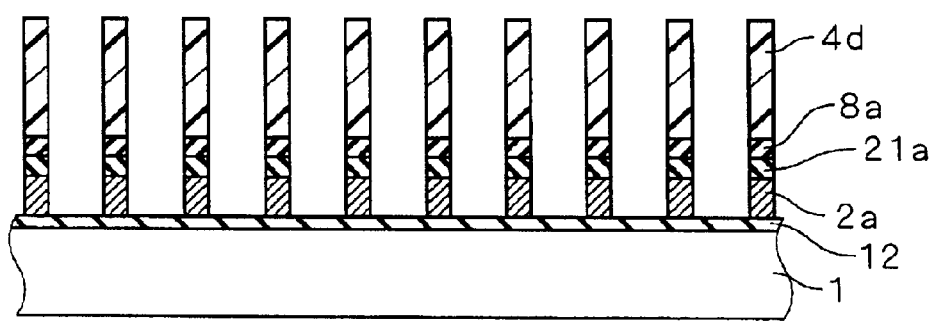

Then, the resist pattern 4d is employed as a mask for etching the silicon oxynitride film 8 and the silicon oxide film 21, then the resist pattern 4d is separated and thereafter the patterned silicon oxynitride film 8 and silicon oxide film 21 are employed as masks for etching the polysilicon layer 2, thereby obtaining a desired wiring pattern (polysilicon pattern 2a) as shown in FIG. 67. Alternatively, the resist pattern 4d may be employed as a mask for etching the silicon oxynitride film 8, the silicon oxide film 21 and the polysilicon layer 2.

In this case, the resist pattern 4d is more improved in etching resistance against etching for the silicon oxide film 21 and the silicon oxynitride film 8 as compared with the resist pattern 4c due to the ion implantation, to serve as an etching mask with no hindrance also when the thickness thereof is reduced in the step shown in FIG. 66.

Further, the resist pattern 4d (4c) is subjected to decomposition due to the exposure and heat treatment (chemical reaction acceleration) shown in FIG. 65, whereby neither gas is generated in the resist pattern 4d nor a problem such as rupture arises in the resist pattern 4d in etching for the silicon oxynitride film 8 and the silicon oxide film 21.

While this embodiment has been described with reference to the gate pattern forming steps employing the polysilicon layer 2 as a wiring pattern forming method, the present invention is also applicable to other steps such as bit line forming steps, metal wiring steps, hole steps or the like, as a matter of course.

Embodiment 9

FIGS. 68 to 73 are sectional views showing capacitor pattern forming steps according to the embodiment 9 of the present invention. FIG. 74 is an explanatory diagram showing a reticle on which a pattern for capacitor forming steps for a DRAM is drawn. The embodiment 9 is on the premise of formation of a capacitor of a DRAM. The procedure of the embodiment 9 is now described with reference to FIGS. 68 to 74.

Figure 68:
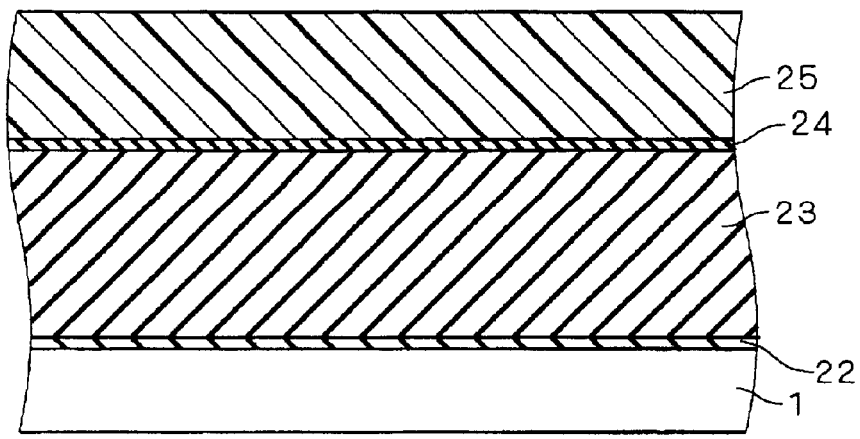
FIGS. 68 to 73 are sectional views showing capacitor pattern forming steps according to an embodiment 9 of the present invention.

As shown in FIG. 68, a silicon nitride film 22 and a silicon oxide film 23 are formed on a silicon substrate 1 in this order in thicknesses of 50 nm and 1500 nm respectively, and a photoresist film 4 is applied onto the silicon oxide film 23 and prebaked at 100° C. for 60 seconds. At this time, the revolution speed in application is so adjusted that the thickness of the photoresist film 4 is 880 nm.

Figure 69:
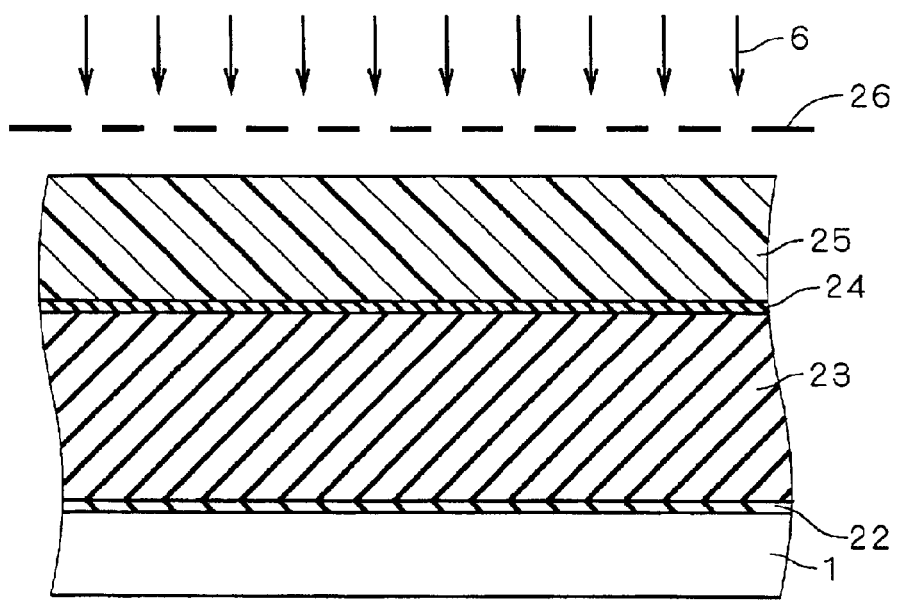

Then, exposure is performed with a stepper having a KrF excimer laser (wavelength: 248 nm) 6 as a light source through a reticle (photomask) 26 (see FIG. 74) on which patterns for the capacitor forming steps for a DRAM are drawn, as shown in FIG. 69. Off-axis illumination employing a ⅔ annular illumination aperture is applied under an illumination condition of NA=0.65.

Figure 70:
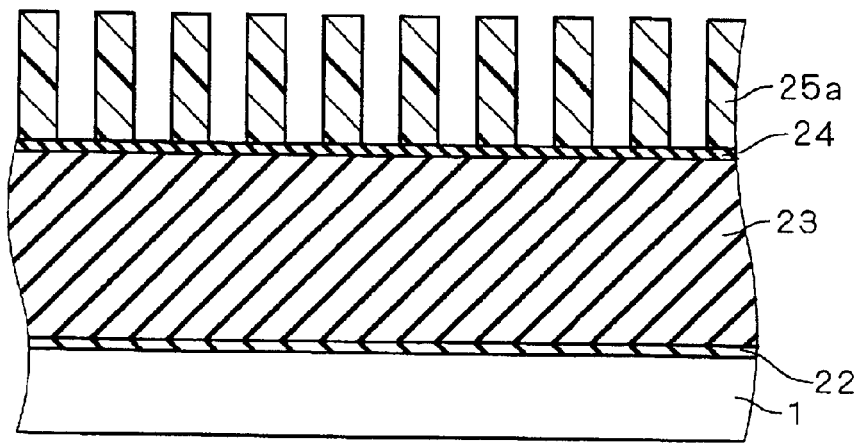

Then, post-exposure baking (PEB) is performed at 110° C. for 90 seconds and thereafter development is performed for 60 seconds with an aqueous solution of 2.38 percent by weight of tetramethylammonium hydroxide (TMAH), thereby obtaining a resist pattern 25a responsive to the reticle 26 as shown in FIG. 70.

Figure 71:
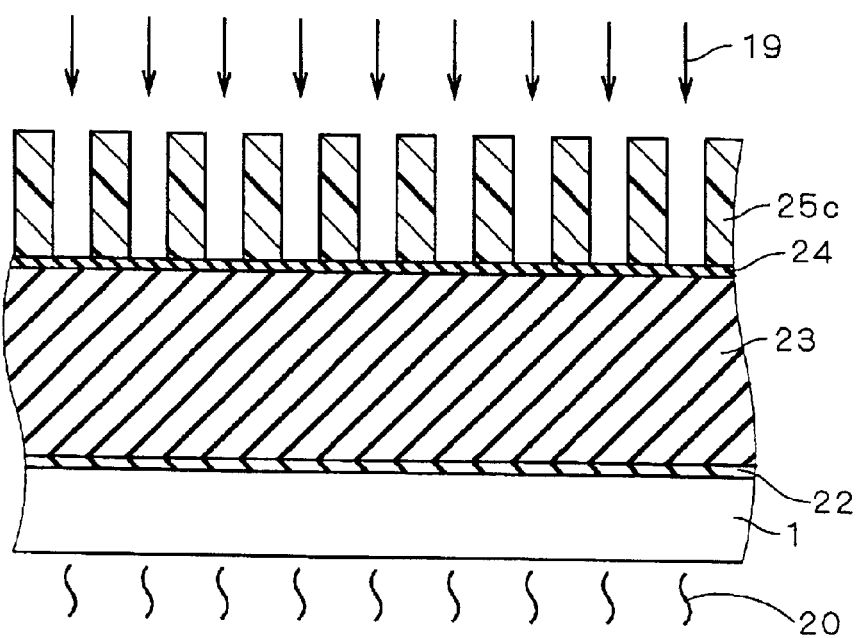

Then, exposure is performed on the resist pattern 25a with a stepper having a KrF excimer laser 19 as a light source and thereafter post-exposure baking is performed through a heat source 20 at 100° C. for 90 seconds for obtaining a resist pattern 25c, as shown in FIG. 71.

The resist pattern 25a can be converted to the resist pattern 25c subjected to decomposition due to the exposure and heat treatment shown in FIG. 71.

Figure 72:
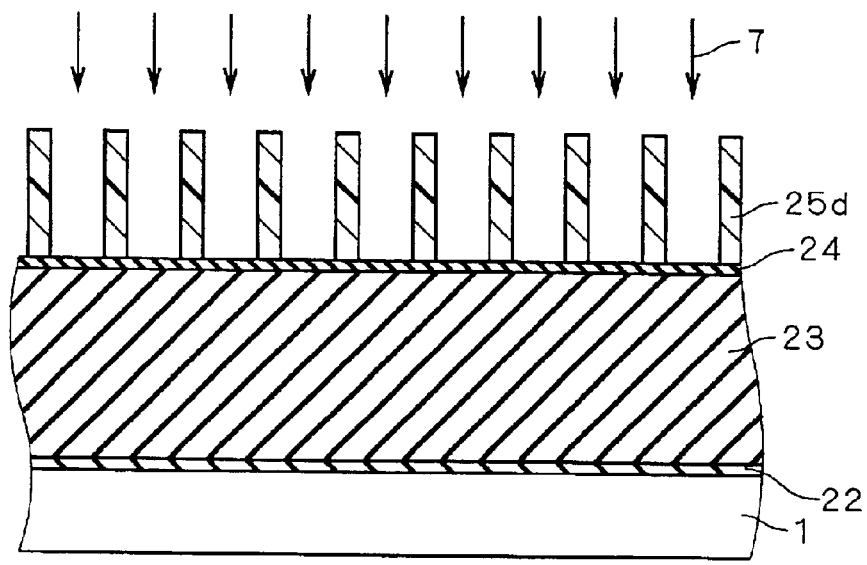

As shown in FIG. 72, argon ions 7 are implanted into the resist pattern 25c under 50 keV at $1\times10^{16}/cm^2$, for obtaining a resist pattern 25d.

The resist pattern 25d causes pattern contraction due to the ion implantation, so that the line width is reduced to 0.11 μm from that of 0.17 μm of the resist pattern 25c.

Figure 73:
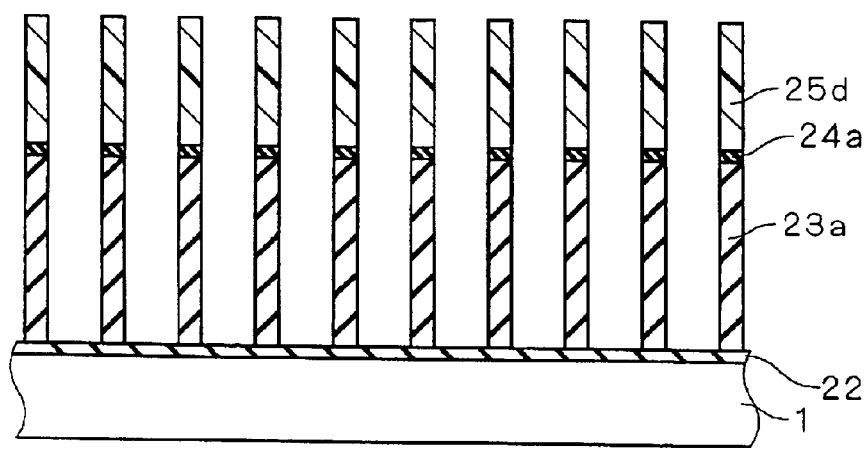
Figure 74:
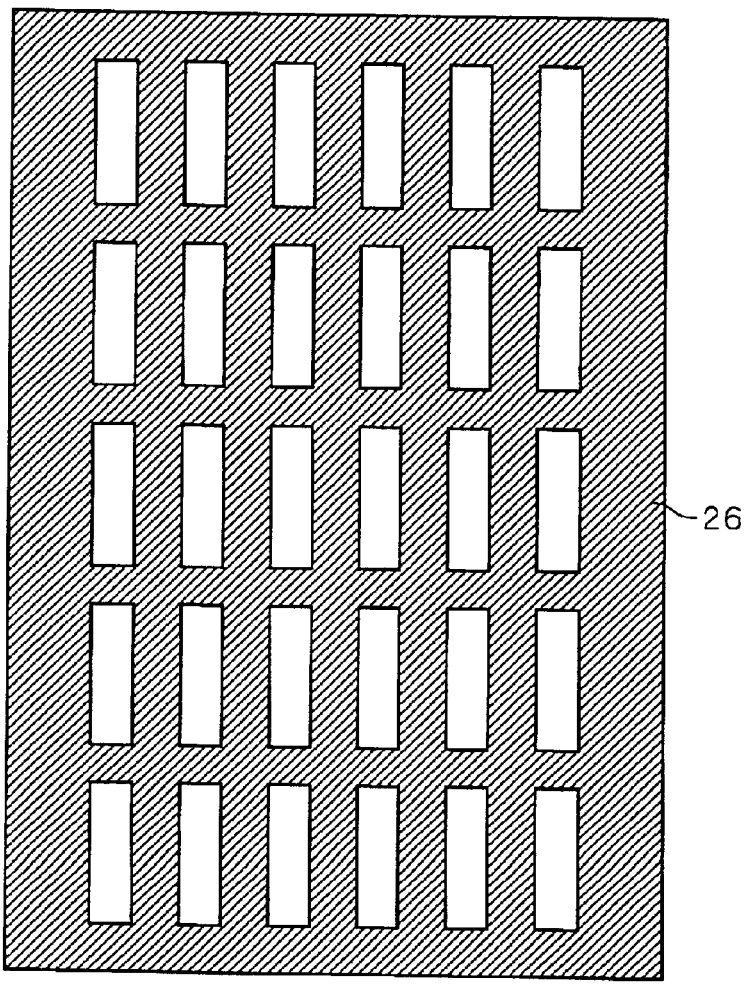
FIG. 74 is an explanatory diagram showing a reticle employed in the embodiment 9.

Then, the resist pattern 25d is employed as a mask for etching the silicon oxide film 23 and the silicon oxynitride film 24, thereby obtaining a capacitor pattern (a silicon oxide film pattern 23a and a silicon oxynitride film pattern 24a) for defining a dielectric substance, as shown in FIG. 73.

In this case, the resist pattern 25d is more improved in etching resistance against etching for the silicon oxide film 23 and the silicon oxynitride film 24 as compared with the resist pattern 25c due to the ion implantation, to serve as an etching mask with no hindrance also when the thickness thereof is reduced from that of the resist pattern 25c in the step shown in FIG. 72.

Further, the resist pattern 25d (25c) is subjected to decomposition due to the exposure and heat treatment shown in FIG. 71, whereby generation of gas can be effectively suppressed as described above, and no problem such as rupture arises in the resist pattern 25d.

In the capacitor forming steps for a DRAM, it is preferable to form a large opening pattern for obtaining large capacitance, i.e., for forming an electrode of polysilicon or the like having a wide surface area, and enlargement of a space width following contraction of a line width can be relatively readily performed by effectively applying this method.

While this embodiment has been described with reference to the capacitor pattern forming steps, a similar effect can be attained by applying the method according to the embodiment 9 to self-aligned contact hole forming steps or stacked via hole forming steps for a DRAM in order to form a large opening pattern.

Embodiment 10

Subject

In the wiring pattern forming method according to the embodiment 4 shown in FIGS. 28 to 35, the wiring pattern is formed by two-layer photoresist application consisting of the first photoresist film 4 and the second photoresist film 14.

Also in this case, there is such a possibility that the first photoresist film 4 may be ruptured in formation of the resist pattern 14b of the photoresist film 14 formed on the resist pattern 4b of the photoresist film 4.

In other words, the resist pattern 4b subjected to ion implantation may be ruptured by gas generated from the inner part of the resist pattern 4b hardened by ion implantation in exposure and post-exposure baking of the photoresist film 14 formed thereon. Such a phenomenon readily takes particularly when the resist pattern 4b has a large area. The embodiment 10 of the present invention solves this problem.

Method

FIGS. 75 to 83 are sectional views showing a wiring pattern forming method according to the embodiment 10 of the present invention. The embodiment 10 relates to gate steps of forming a fine line pattern having a transistor part of not more than 0.1 μm and a cover for providing a contact hole for connection with an upper or lower layer. The procedure of the embodiment 10 is now described with reference to FIGS. 75 to 83.

Formation of a transistor having a smaller line width is required for a high-speed operation of a device, while a cover for a contact hole must be largely formed for ensuring a contact area. Further, it is important to minimize the space between covers in order to highly integrate the device.

As shown in the embodiments 8 and 9, a thin line pattern of a transistor part can be formed by utilizing pattern contraction resulting from ion implantation, while it is not preferable to contract the contact cover part due to the aforementioned reason. Thus, a method of performing two photolithography steps with a two-layer photoresist film similarly to the embodiment 4 is effective.

Figure 75:
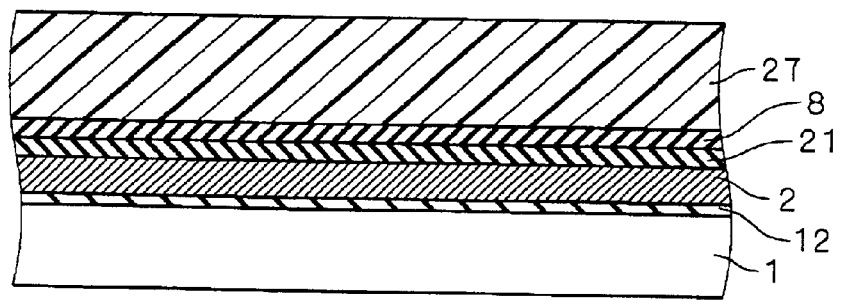
FIGS. 75 to 83 are sectional views showing a wiring pattern forming method according to an embodiment 10 of the present invention.

As shown in FIG. 75, a silicon oxide film 12, a polysilicon layer 2, a silicon oxide film 21 and a silicon oxynitride film 8 are formed on a silicon substrate 1 in thicknesses of 15 nm (150 Å), 100 nm (1000 Å), 50 nm (500 Å) and 48 nm (480 Å) respectively, and thereafter a photoresist film 27 is applied and prebaked at 100° C. for 90 seconds. In this case, the revolution speed in application is so adjusted that the thickness of the photoresist film 27 is 585 nm.

Figure 76:
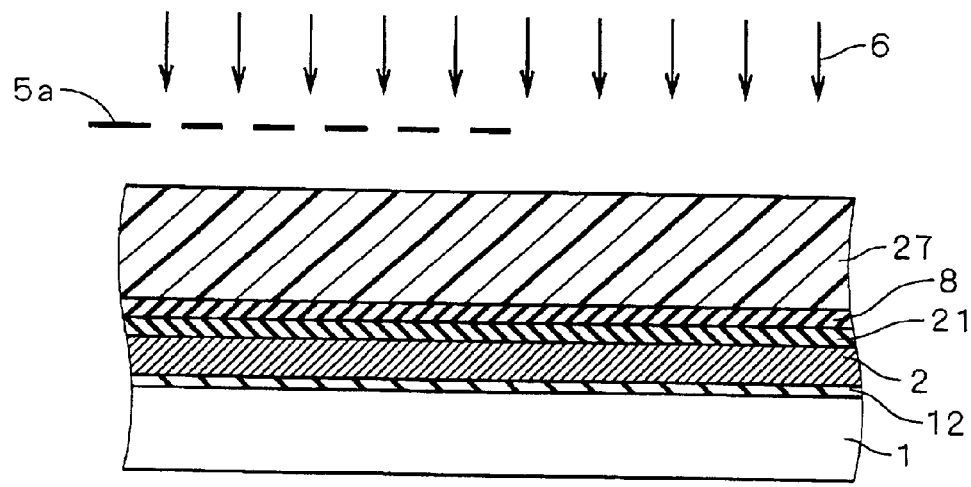

Then, exposure is performed with a stepper having a KrF excimer laser (wavelength: 248 nm) 6 as a light source through a reticle (photomask) 5a on which only a wiring pattern for a transistor forming region serving as a first work area is drawn, as shown in FIG. 76. Off-axis illumination employing a ⅔ annular illumination aperture is applied under an illumination condition of NA=0.65.

Figure 77:
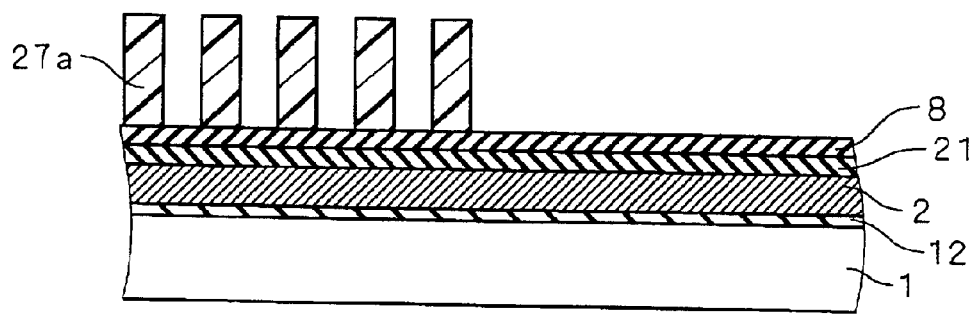

Then, post-exposure baking (PEB) is performed at 110° C. for 90 seconds and thereafter development is performed for 60 seconds with an aqueous solution of 2.38 percent by weight of tetramethylammonium hydroxide (TMAH), thereby obtaining a relatively dense resist pattern 27a having a line width of 0.14 μm as shown in FIG. 77.

Then, exposure is performed on the resist pattern 27a with a stepper having a KrF excimer laser 19 as a light source and thereafter post-exposure baking is performed through a heat source 20 at 100° C. for 90 seconds for obtaining a resist pattern 27c. The wavelength of the KrF excimer laser 19 is 248 nm.

Figure 78:
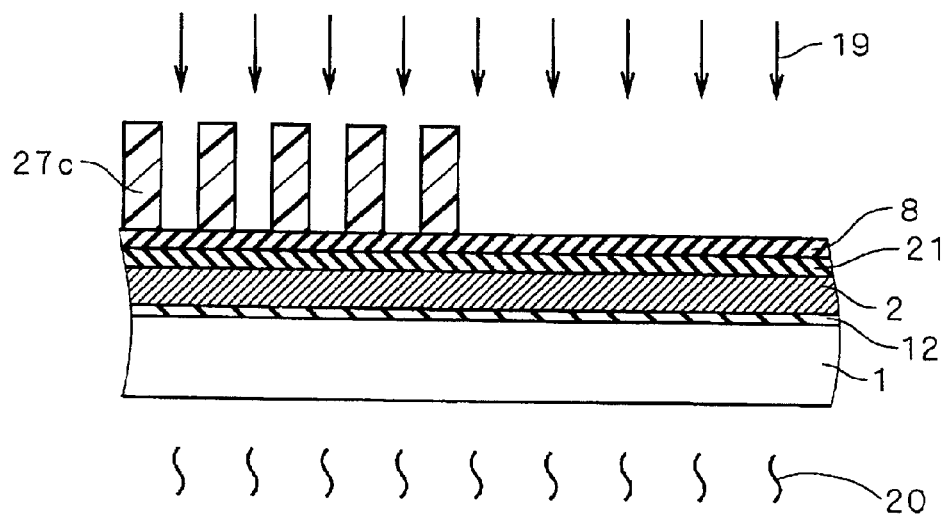

Due to the exposure and heat treatment shown in FIG. 78, decomposition of the resist pattern 27c can be facilitated as compared with the resist pattern 27a.

Figure 79:
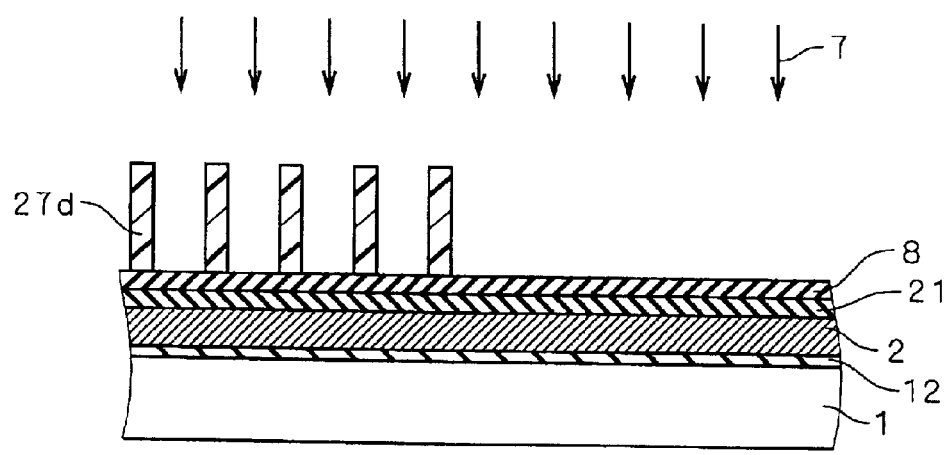

As shown in FIG. 79, argon ions 7 are implanted into the resist pattern 27c for performing ion implantation under 50 keV at $1\times10^{16}/cm^2$ for obtaining a resist pattern 27d. Due to this ion implantation, the resist pattern 27d contracts in thickness from the resist pattern 27c as described above, and is improved in etching resistance against etching for the silicon oxide film 21 and the silicon oxynitride film 8.

Figure 80:
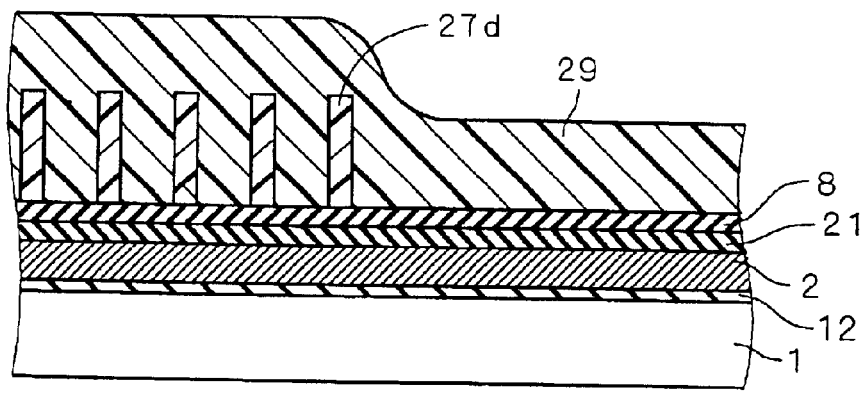

Then, a photoresist film 29 is applied to/formed on the overall surface including the resist pattern 27d, as shown in FIG. 80. The conditions for this application are identical to those for the first photoresist film 27.

Figure 81:
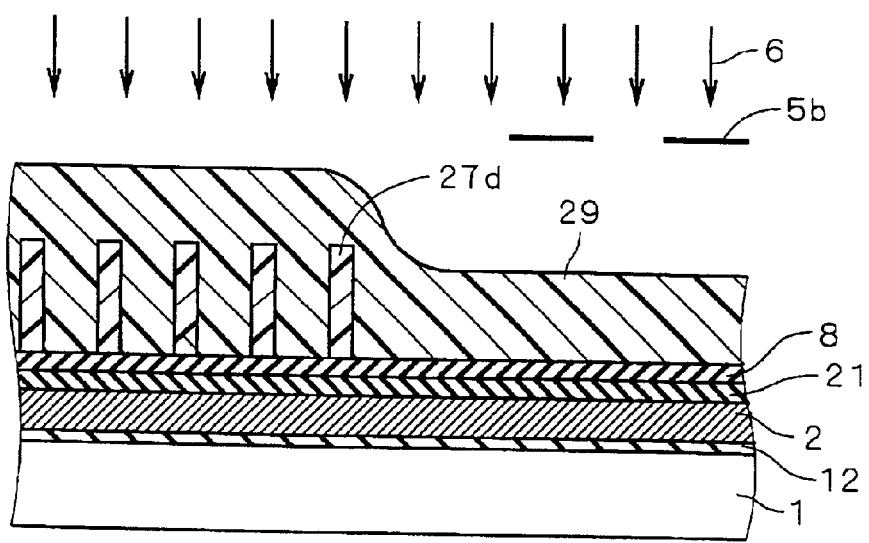

Then, exposure is performed with a stepper having a KrF excimer laser (wavelength: 248 nm) 6 as a light source through a reticle (photomask) 5b drawn in correspondence to a contact hole forming region which is a second work area excluding the transistor forming region, as shown in FIG. 81. Off-axis illumination employing a ⅔ annular illumination aperture is applied under an illumination condition of NA=0.65.

Figure 82:
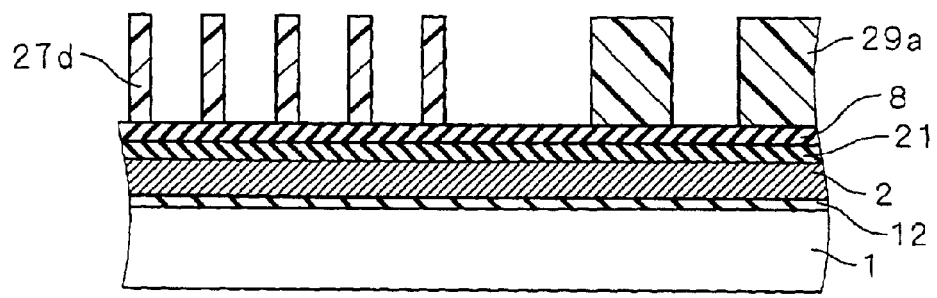

Then, post-exposure baking (PEB) is performed at 110° C. for 90 seconds and thereafter development is performed for 60 seconds with an aqueous solution of 2.38 percent by weight of tetramethylammonium hydroxide (TMAH), thereby obtaining a resist pattern 29a, as shown in FIG. 82.

In this case, decomposition of the resist pattern 27d (27c) is facilitated due to the exposure and heat treatment shown in FIG. 78, and hence the aforementioned problem of gas can be effectively suppressed and no problem such as rupture is caused in the resist pattern 27d.

Figure 83:
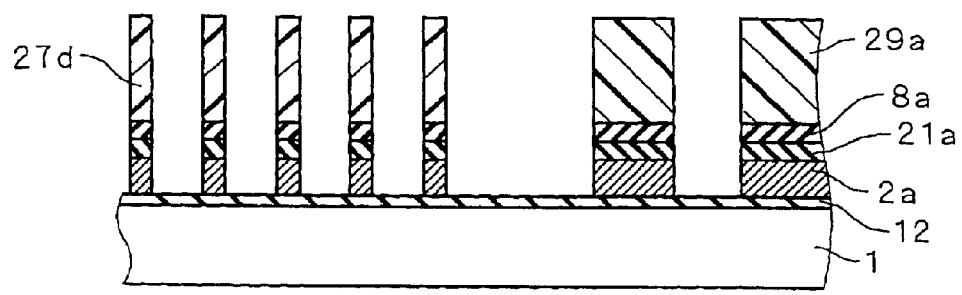

Then, the silicon oxynitride film 8 and the silicon oxide film 21 are etched through the resist patterns 27d and 29a serving as masks, thereafter the resist patterns 27d and 29a are separated, and the polysilicon layer 2 is etched through the patterned silicon oxynitride film 8 and silicon oxide film 21 serving as masks for obtaining a desired wiring pattern (polysilicon pattern 2a), as shown in FIG. 83. Alternatively, the silicon oxynitride film 8, the silicon oxide film 21 and the polysilicon layer 2 may be collectively etched through the masks of the resist patterns 27d and 29a.

At this time, the resist pattern 27c is improved in etching resistance against the etching for the silicon oxynitride film 8 and the silicon oxide film 21 from the resist pattern 27c due to the ion implantation, to serve as an etching mask with no hindrance even if the thickness thereof contracts from that of the resist pattern 25c in the step shown in FIG. 79.

According to the method of the embodiment 10, the resist pattern 27d having a smaller line width than a mask size can be formed on the transistor forming region while the resist pattern 29a can be formed on the region other than the transistor forming region with no deterioration of precision, for precisely forming wiring patterns different in line width from each other.

While this embodiment has been described with reference to the gate pattern forming steps employing the polysilicon layer 2 as a wiring pattern forming method, the present invention is also applicable to other steps such as bit line forming steps, metal wiring steps, hole steps or the like, as a matter of course.

Embodiment 11

Subject

The embodiment 11 of the present invention relates to a wiring pattern forming method in the case of requiring higher etching resistance when forming hardly simultaneously formable patterns through two photolithography steps similarly to the embodiment 10.

The wiring pattern forming method according to the embodiment 11 is on the premise that ArF resist is employed for obtaining finer patterns than those in the embodiment 10. ArF resist is inferior in dry etching resistance to KrF resist, and reduction of the thickness thereof is desired. The method according to the embodiment 12 performs ion implantation also as to a second photoresist film for improving etching resistance.

Method

FIGS. 84 to 94 are sectional views showing the wiring pattern forming method according to the embodiment 11 of the present invention. The embodiment 11 relates to gate steps of forming a fine line pattern having a transistor part of not more than 0.1 μm and a cover for providing a contact hole for connection with an upper or lower layer. The procedure of the embodiment 11 is now described with reference to FIGS. 84 to 94.

Figure 84:
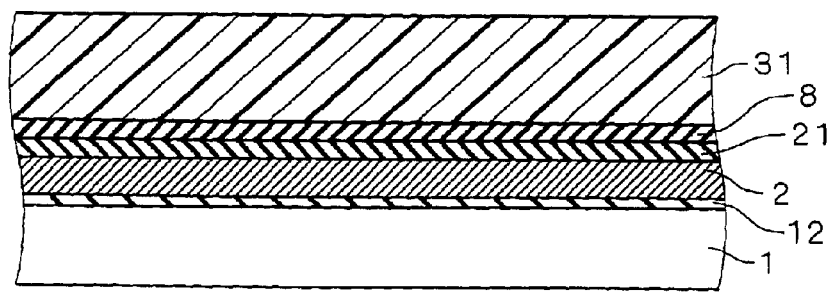
FIGS. 84 to 94 are sectional views showing a wiring pattern forming method according to an embodiment 11 of the present invention.

First, a silicon oxide film 12, a polysilicon layer 2, a silicon oxide film 21 and a silicon oxynitride film 8 are formed on a silicon substrate 1 in thicknesses of 15 nm, 100 nm, 50 nm and 48 nm respectively as shown in FIG. 84, and thereafter a photoresist film 31 is applied and thereafter prebaked at 100° C. for 90 seconds. At this time, the revolution speed in application is so adjusted that the thickness of the photoresist film 31 is 400 nm (4000 Å).

Figure 85:
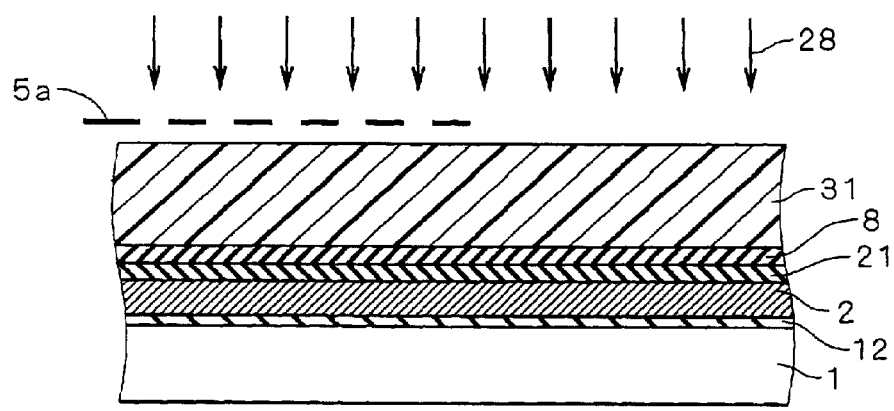

Then, exposure is performed with a stepper having an ArF excimer laser (wavelength: 193 nm) 28 as a light source through a reticle (photomask) 5a on which only a wiring pattern for a transistor forming region is drawn, as shown in FIG. 85. Off-axis illumination employing a ⅔ annular illumination aperture is applied under an illumination condition of NA =0.60.

Figure 86:
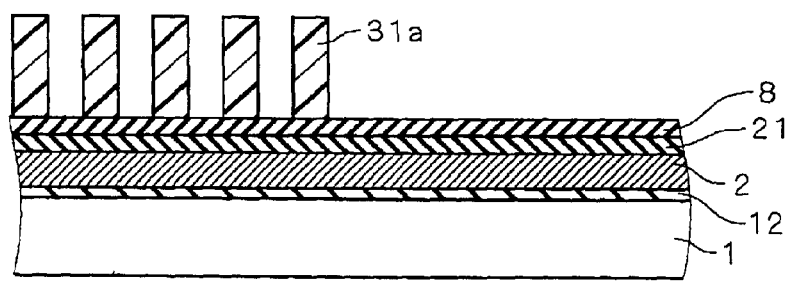

Then, post-exposure baking (PEB) is performed at 110° C. for 90 seconds and thereafter development is performed for 60 seconds with an aqueous solution of 2.38 percent by weight of tetramethylammonium hydroxide (TMAH), thereby obtaining a resist pattern 31a having a line width of 0.12 μm as shown in FIG. 86.

Figure 87:
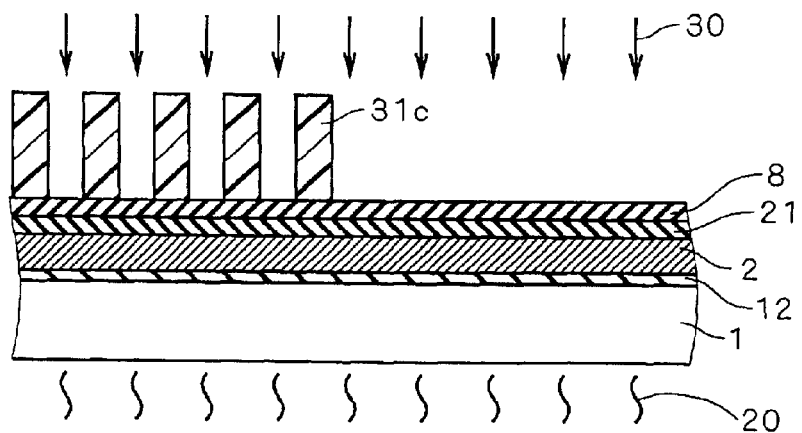

Then, exposure is performed on the resist pattern 31a with a stepper having an ArF excimer laser 30 as a light source and thereafter post-exposure baking is performed through a heat source 110 at 100° C. for 90 seconds for obtaining a resist pattern 31c, as shown in FIG. 87. The wavelength of the ArF excimer laser 30 is 193 nm.

Due to the exposure and heat treatment shown in FIG. 87, decomposition of the resist pattern 31c can be facilitated as compared with the resist pattern 31a.

Figure 88:
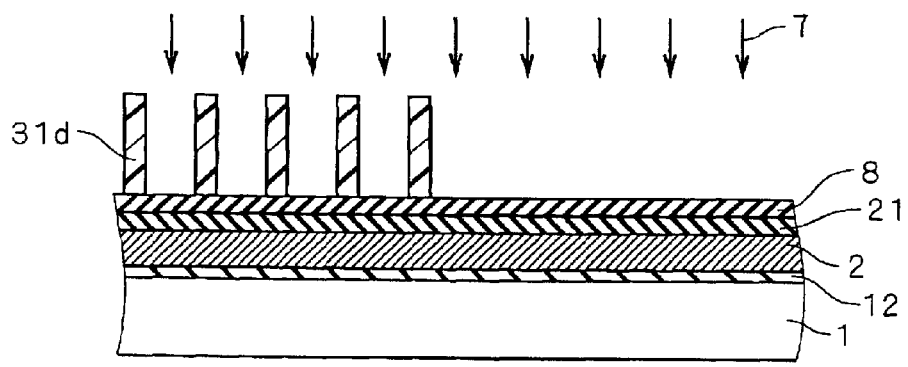

As shown in FIG. 88, argon ions 7 are implanted into the resist pattern 31c for performing ion implantation under 50 keV at $1 \times 10^{16}/cm^2$ for obtaining a resist pattern 31d.

Due to this ion implantation, the resist pattern 31d contracts in thickness from the resist pattern 31c as described above, and is improved in etching resistance against etching for the silicon oxide film 21 and the silicon oxynitride film 8. Further, the resist pattern 31d obtained after the ion implantation contracts from the line width of 0.12 μm of the resist pattern 31c to a line width of 0.08 μm.

Figure 89:
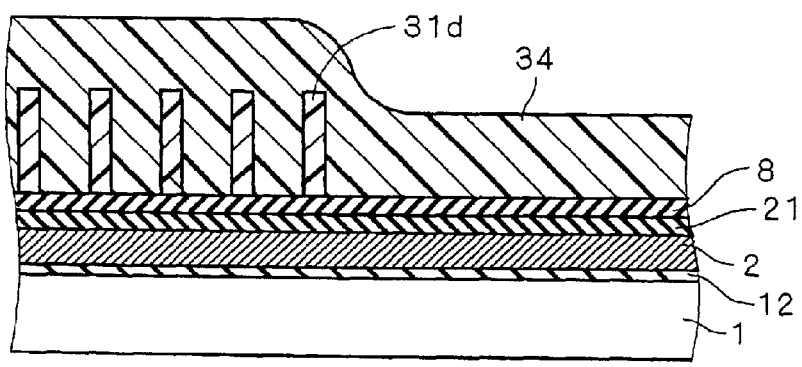

Then, a photoresist film 34 is applied to/formed on the overall surface including the resist pattern 31d, as shown in FIG. 89. The conditions for this application are identical to those for the first photoresist film 27.

Figure 90:
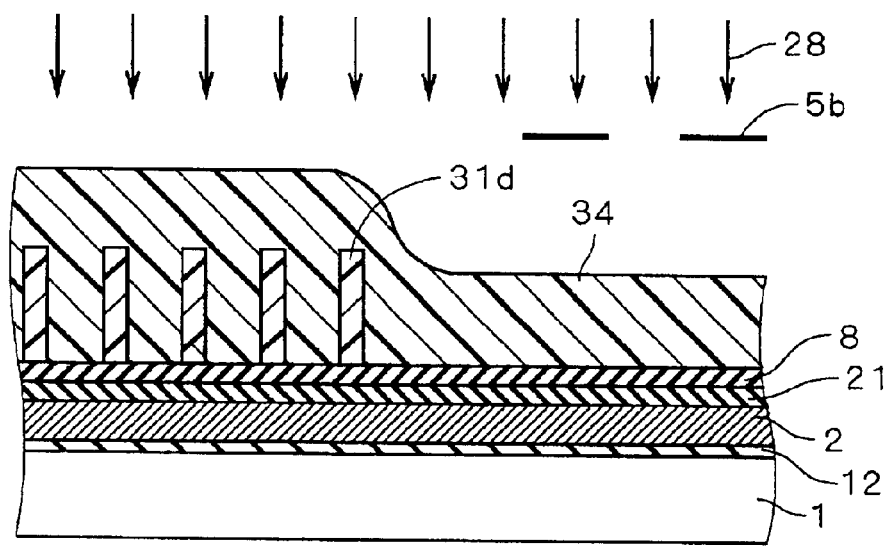

Then, exposure is performed with a stepper having an ArF excimer laser (wavelength: 248 nm) 28 as a light source through a reticle (photomask) 5b drawn in correspondence to a contact hole forming region excluding the transistor forming region, as shown in FIG. 90. Off-axis illumination employing a ⅔ annular illumination aperture is applied under an illumination condition of NA=0.60.

Figure 91:
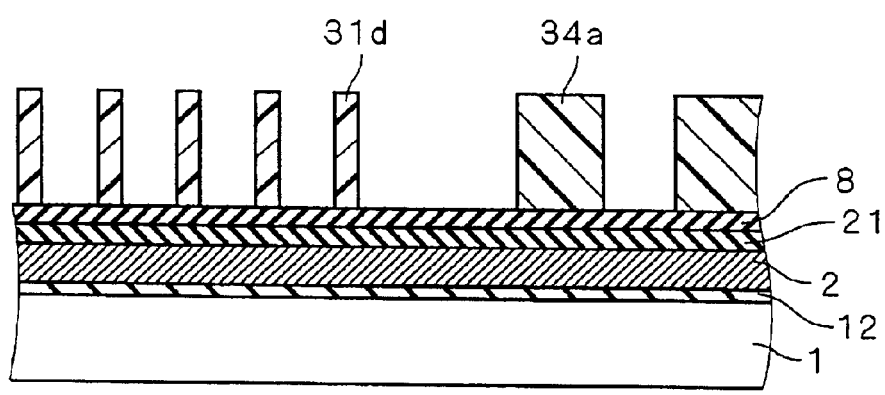

Then, post-exposure baking (PEB) is performed at 110° C. for 90 seconds and thereafter development is performed for 60 seconds with an aqueous solution of 2.38 percent by weight of tetramethylammonium hydroxide (TMAH), thereby obtaining a resist pattern 34a, as shown in FIG. 91.

In this case, decomposition of the resist pattern 31d (27c) is facilitated due to the exposure and heat treatment shown in FIG. 87, and hence the aforementioned problem of gas can be effectively suppressed and no problem such as rupture is caused in the resist pattern 31d.

Figure 92:
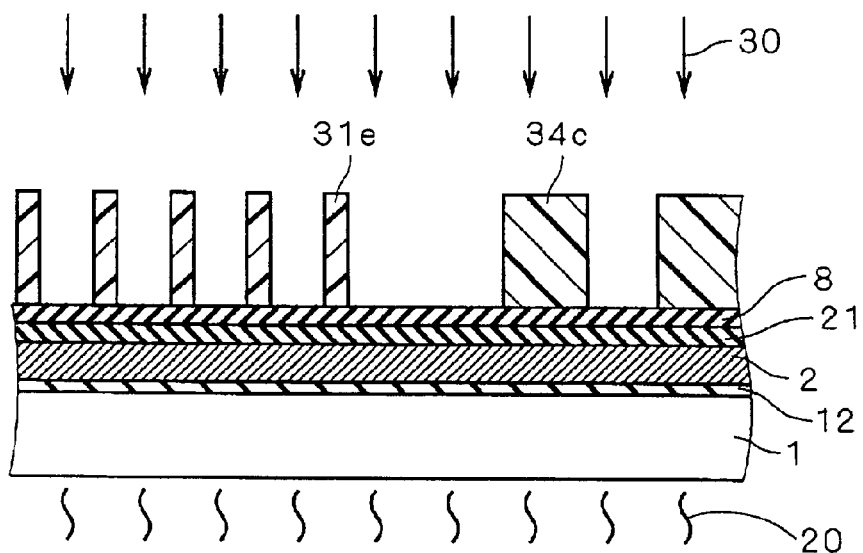

Then, exposure is performed on the resist patterns 31d and 34a with a stepper having an ArF excimer laser (wavelength: 193 nm) 30 as a light source and thereafter post-exposure baking is performed at 100° C. for 90 seconds for obtaining resist patterns 31e and 34c, as shown in FIG. 92.

Figure 93:
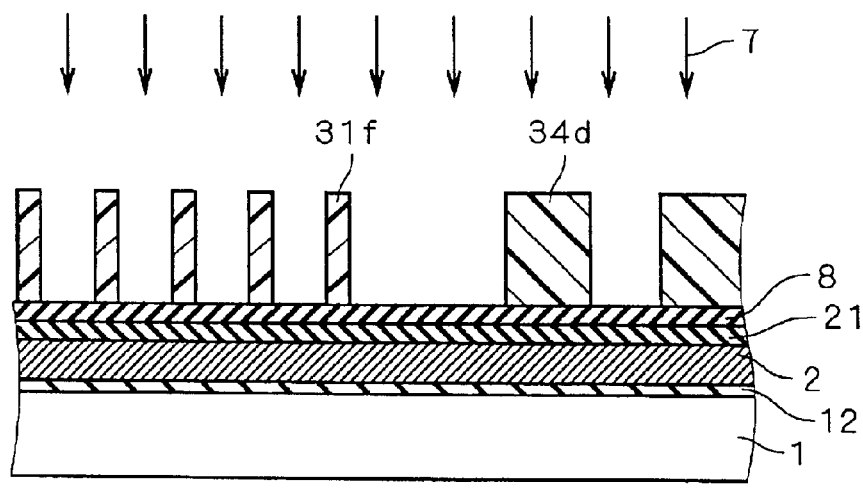

As shown in FIG. 93, argon ions 7 are implanted into the resist patterns 3e and 34c for performing ion implantation under 50 keV at $1 \times 10^{15}/cm^2$ for obtaining resist patterns 31f and 34d.

The amounts of contraction of the resist patterns 31f and 34d with respect to the resist patterns 31e and 34c can be minimized by reducing the amount of ion implantation in the ion implantation step shown in FIG. 93 as compared with the amount of ion implantation in the ion implantation step shown in FIG. 88.

Due to the ion implantation step shown in FIG. 93, the resist pattern 31f (the pattern for the transistor forming region) and the resist pattern 34d (the pattern for the region other than the transistor forming region) can be improved in etching resistance than the resist patterns 31e and 34c respectively.

Figure 94:
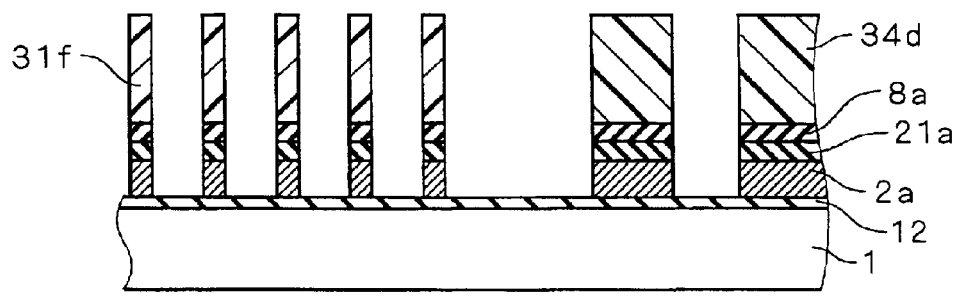

Then, the silicon oxynitride film 8 and the silicon oxide film 21 are etched through the resist pattern 31f and the resist pattern 34d serving as masks, thereafter the resist patterns 31f and 34d are separated, and the polysilicon layer 2 is etched through the patterned silicon oxynitride film 8 and silicon oxide film 21 serving as masks for obtaining a desired wiring pattern (polysilicon pattern 2a), as shown in FIG. 94. Alternatively, the silicon oxynitride film 8, the silicon oxide film 21 and the polysilicon layer 2 may be collectively etched through the masks of the resist patterns 31f and 34d.

At this time, the resist patterns 31f and 34d are improved in etching resistance against the etching for the silicon oxynitride film 8 and the silicon oxide film 21 from the resist pattern 31c due to ion implantation, to serve as etching masks with no hindrance even if the thickness of the resist pattern 31f contracts in the ion implantation steps shown in FIGS. 88 and 93 and the thickness of the resist pattern 34d contracts in the ion implantation step shown in FIG. 93.

Further, decomposition of the resist pattern 31f (31e) and the resist pattern 34d (34c) is facilitated due to the exposure and heat treatment shown in FIG. 82, and hence the aforementioned problem of gas can be effectively suppressed and no problem such as rupture is caused in the resist patterns 31f and 34d.

According to the method of the embodiment 11, the resist pattern 31f having a smaller line width than a mask size can be formed on the transistor forming region while the resist pattern 34d can be formed on the region other than the transistor forming region with no deterioration of precision, for precisely forming wiring patterns different in line width from each other.

While this embodiment has been described with reference to the gate pattern forming steps employing the polysilicon layer 2 as a wiring pattern forming method, the present invention is also applicable to other steps such as bit line forming steps, metal wiring steps, hole steps or the like, as a matter of course.

Embodiment 12

FIGS. 95 to 99 are sectional views showing gate pattern forming steps included in a wiring pattern forming method according to the embodiment 12 of the present invention. The procedure of the embodiment 12 is now described with reference to FIGS. 95 to 99.

Figure 95:
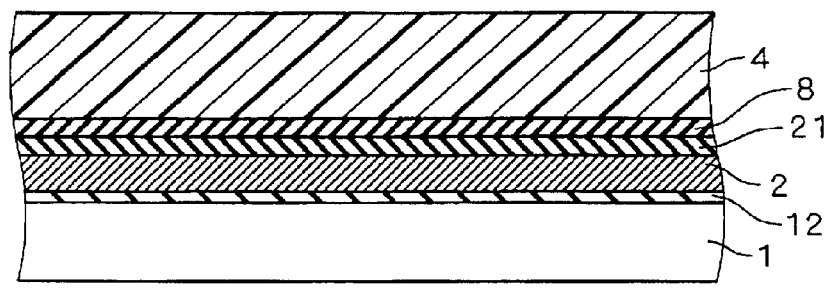
FIGS. 95 to 99 are sectional views showing gate pattern forming steps according to an embodiment 12 of the present invention.

As shown in FIG. 95, a silicon oxide film 12, a polysilicon layer 2, a silicon oxide film 21 and a silicon oxynitride film 8 are formed on a silicon substrate 1 in thicknesses of 15 nm, 100 nm, 50 nm and 48 nm respectively, and thereafter a photoresist film 4 is applied onto the silicon oxynitride film 8 and prebaked at 100° C. for 90 seconds. In this case, the revolution speed in application is so adjusted that the thickness of the photoresist film 4 is 585 nm.

Figure 96:
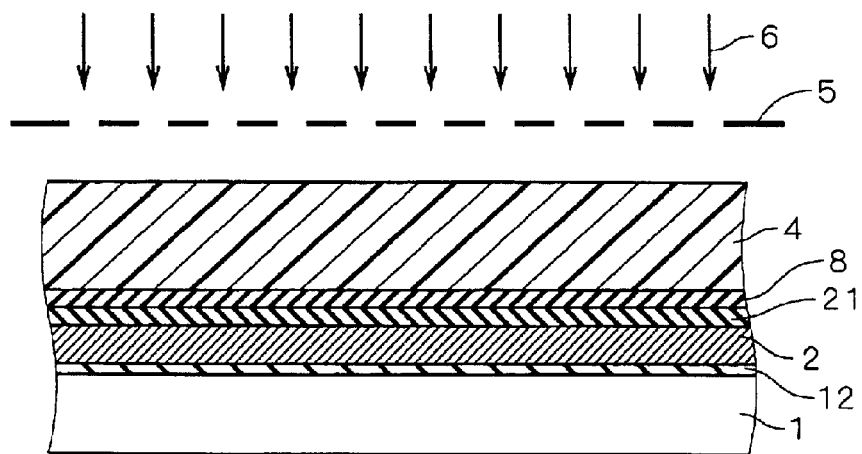

Then, exposure is performed with a stepper having a KrF excimer laser 6 as a light source through a reticle 5 on which a wiring pattern is drawn, as shown in FIG. 96. Off-axis illumination employing a ⅔ annular illumination aperture is applied under an illumination condition of NA =0.65.

Figure 97:
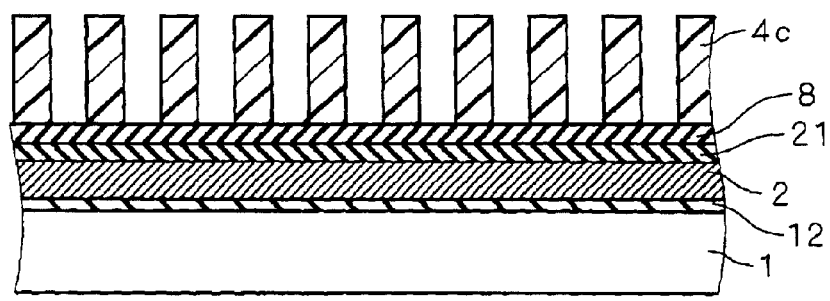

Then, post-exposure baking (PEB) is performed at 110° C. for 90 seconds and thereafter development is performed for 60 seconds with an aqueous solution of 2.38 percent by weight of tetramethylammonium hydroxide (TMAH), thereby obtaining a resist pattern 4a responsive to the reticle 5 as shown in FIG. 97.

Figure 98:
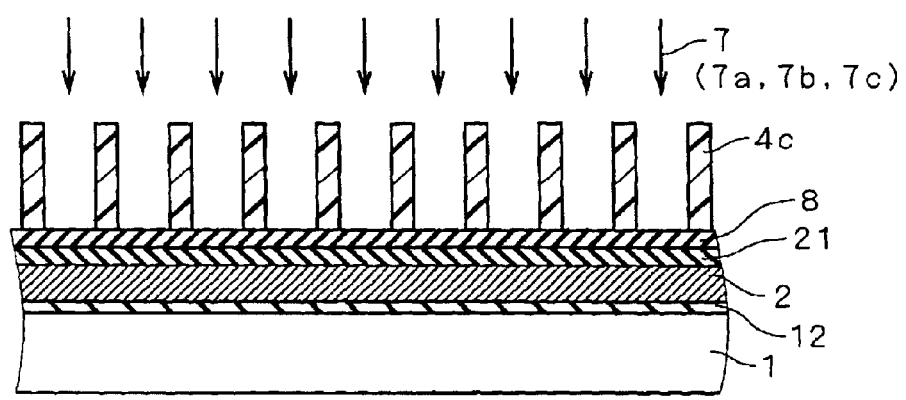

As shown in FIG. 98, ions 7a, 7b and 7c are successively implanted into the resist pattern 4a in three steps. In this case, boron is employed as the ion species for implanting the ions 7a under 150 keV (implantation energy) at $4 \times 10^{15}/cm^2$ (dose), implanting the ions 7b under 90 keV at $3 \times 10^{15}/cm^2$ and implanting the ions 7c under 40 keV at $3 \times 10^{15}/cm^2$. Due to such partial ion implantation of the ions 7a to 7c in three steps, the resist pattern 4a contracts in thickness and is improved in etching resistance against etching for the silicon oxide film 21 and the silicon oxynitride film 8.

Figure 100:
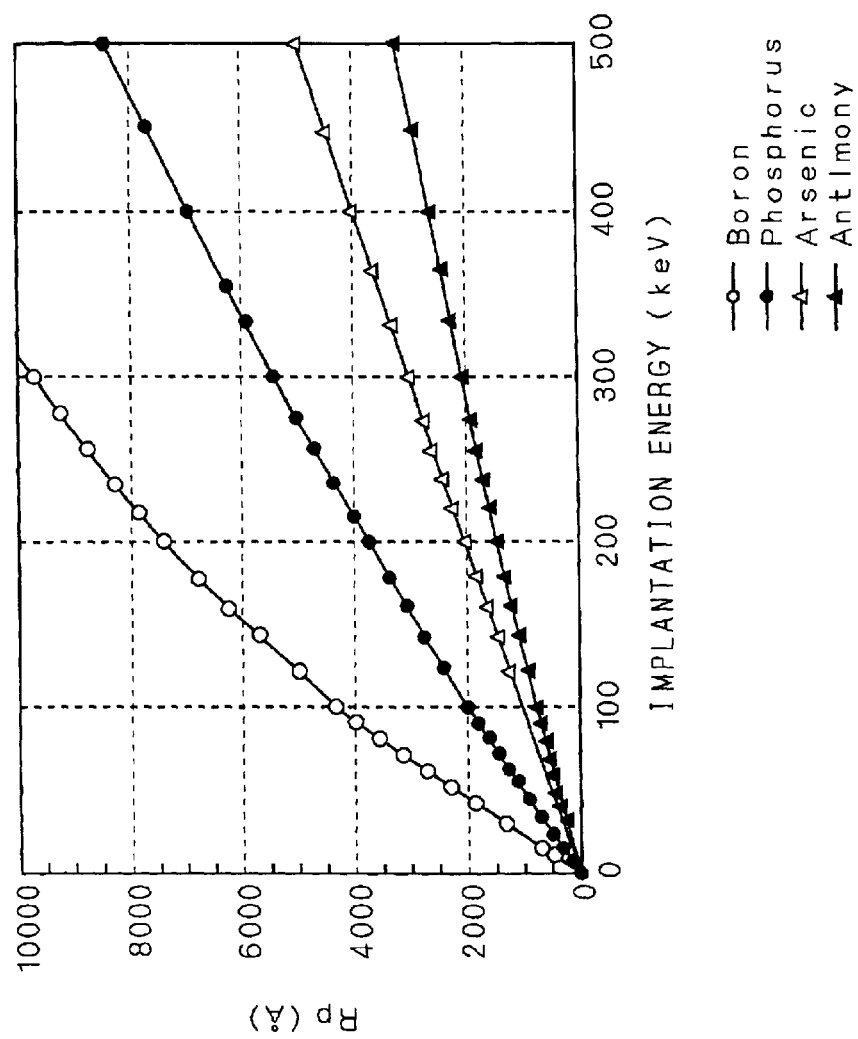
FIG. 100 is a graph showing the relation between ion implantation energy and a mean range.

FIG. 100 is a graph showing the relation between ion implantation energy (keV) and a mean range Rp (Å). Referring to FIG. 100, white circles, black circles, white triangles and black triangles denote boron, phosphorus, arsenic and antimony respectively. Implanted ions are scattered by colliding with atoms contained in resist and distributed along the mean range Rp shown in FIG. 100 while drawing a complicated locus.

Therefore, the mean range Rp of boron is set on the lower part, the intermediate part and the upper part of the resist pattern 4a due to implantation of the ions 7a (first partial ion implantation), implantation of the ions 7b (second partial ion implantation) and implantation of the ions 7c (third partial ion implantation), whereby the resist pattern 4a is substantially homogeneously hardened from the upper portion to the bottom portion due to implantation of boron ions into the upper portion and the bottom portion of the resist pattern 4a.

Figure 99:
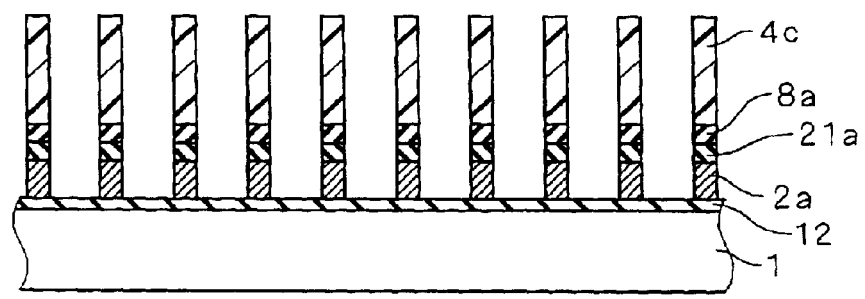

Then, the silicon oxynitride film 8 and the silicon oxide film 21 are etched through the resist pattern 4a serving as a mask, thereafter the resist pattern 4a is separated, and the polysilicon layer 2 is etched through the patterned silicon oxynitride film 8 and silicon oxide film 21 serving as masks for obtaining a desired wiring pattern (polysilicon pattern 2a), as shown in FIG. 99. Alternatively, the silicon oxynitride film 8, the silicon oxide film 21 and the polysilicon layer 2 may be collectively etched through the mask of the resist pattern 4a.

At this time, the resist pattern 4a is substantially homogeneously hardened from the upper portion and the bottom portion along the thickness, whereby normal etching can be performed with no rupture of the resist pattern 4a even if the resist pattern 4a is a readily ruptured large-area pattern.

Others

While argon (Ar) or boron (B) is employed as the implanted ion species in each of the aforementioned embodiments, a similar effect can also be attained with another ion species such as helium (He), neon (Ne), nitrogen (N, $N_2$), carbon (C), carbon monoxide (CO), phosphorus (P), arsenic (As), antimony (Sb), boron fluoride (BF), fluorine (F), silicon (Si) or germanium (Ge).

Further, ion implantation performing curing may be replaced with electron beam application, deep UV application around a wavelength λ of 250 to 450 nm, for attaining a similar effect. The point is that curing in a wide meaning capable of contracting a pattern and improving etching resistance may be performed on a resist pattern.

The material for the photoresist film is not restricted to KrF excimer resist or ArF resist but may effectively be prepared from any material such as g-ray resist, i-ray resist, VUV ($F_2$) excimer resist, electron beam resist or X-ray resist.

The exposure and the heat treatment, i.e., chemical reaction acceleration shown in the embodiments 8 to 11 are performed for accelerating decomposition of the resist pattern by the photoresist film. Therefore, only either the exposure or the heat treatment may be performed so far as decomposition of the resist pattern can be accelerated.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device, comprising steps of:
   (1) predetermining a first thickness of a first resist film and an ion implantation level that will cause the first thickness to contract to a second thickness;
   (a) forming an etching object on a semiconductor substrate;
   (b) forming said first resist film with said first thickness on said etching object;
   (c) patterning said first resist film to obtain a first resist pattern;
   (d) performing ion implantation into said first resist pattern with said ion implantation level set so that the first predetermined thickness contracts to said second thickness; and
   (e) executing predetermined etching on said etching object using said first resist pattern as a mask to obtain a work pattern, after execution of said steps (c) and (d), wherein
      said second thickness of said first resist pattern includes a thickness satisfying such a condition that a difference in critical dimension shift in said work pattern with respect to said first resist pattern caused between a dense pattern portion and a rough pattern portion in said work pattern is not more than a predetermined reference value and does not hinder said predetermined etching.

2. The method of manufacturing a semiconductor device according to claim 1, wherein
   said etching object includes an actual etching object and an ion prevention film, said step (a) includes steps of:
      (a-1) forming said actual etching object on said semiconductor substrate, and
      (a-2) forming said ion prevention film on said actual etching object,
   said ion implantation in said step (d) includes ion implantation from above said first resist pattern, and
   said ion prevention film prevents ions implanted in said step (d) from being implanted into said actual etching object.

3. The method of manufacturing a semiconductor device according to claim 2, wherein
   said ion prevention film includes a silicon nitride film or a silicon oxynitride film, and
   said step (a-2) includes a step of forming said ion prevention film by plasma CVD.

4. The method of manufacturing a semiconductor device according to claim 2, wherein
   said ion prevention film includes an organic antireflection coating.

5. The method of manufacturing a semiconductor device according to claim 4, wherein
   said step (a) further includes a step of:
      (a-3) performing ion implantation into said organic antireflection coating forming said ion prevention film.

6. The method of manufacturing a semiconductor device according to claim 1, wherein
   said etching object includes first and second work areas,
   said first resist pattern includes a pattern for an etching mask for said first work area,
   said method further includes steps of:
      (f) forming a second resist film at least on said second work area after execution of said step (d), and
      (g) patterning said second resist film to obtain a second resist pattern for an etching mask for said second work area, and
   said step (e) includes a step of executing said predetermined etching using said second resist pattern as a mask in addition to said first resist pattern.

7. The method of manufacturing a semiconductor device according to claim 6, wherein
   said step (f) includes a step of forming said second resist film on the overall surface of said etching object including said first pattern, and
   said first resist pattern is not substantially removed in execution of said step (g) due to composition change resulting from said ion implantation in said step (d).

8. The method of manufacturing a semiconductor device according to claim 1, wherein
   said ion implantation in said step (d) includes ion implantation performed obliquely from above with respect to a vertical line a surface formed with said first resist pattern.

9. The method of manufacturing a semiconductor device according to claim 1, wherein
   said etching object has asperities on its surface, and
   said method further comprises a step of:
      (h) performing ion implantation into said etching object before executing said step (b).

10. The method of manufacturing a semiconductor device according to claim 9, wherein
    said step (b) includes a step of performing exposure on said first resist film through a reticle of a predetermined pattern and thereafter executing development thereby obtaining said first resist pattern.

11. The method of manufacturing a semiconductor device according to claim 9, wherein
    said etching object has a mark for mask alignment on its surface.

12. The method of manufacturing a semiconductor device according to claim 11, wherein
    said step (h) includes steps of:
       (h-1) forming a third resist film on said etching object,
       (h-2) patterning said third resist film to obtain a third resist pattern, said third resist pattern having an opening on a mark forming region including said mark, and
       (h-3) performing ion implantation into said mark forming region of said etching object using said third resist pattern as a mask.

13. The method of manufacturing a semiconductor device according to claim 1, wherein
    said ion implantation in said step (d) includes a plurality of partial ion implantation operations different in implantation energy from each other.

14. A method of manufacturing a semiconductor device comprising steps of:
    (a) forming an etching object on a semiconductor substrate;
    (b) forming a first resist film on said etching object;
    (c) patterning said first resist film to obtain a first resist pattern;
    (d) performing chemical reaction acceleration for accelerating decomposition on said first resist pattern;
    (e) performing curing including one of ion implantation, electron beam irradiation and ultraviolet irradiation on said first resist pattern, the thickness of said first resist pattern contracting by said curing in said step (e); and (f) executing predetermined etching on said etching object using said first resist pattern as a mask to obtain a work pattern after execution of said steps (c) to (e).

15. The method of manufacturing a semiconductor device according to claim 14, wherein said etching object includes first and second work areas, said first resist pattern includes a pattern for an etching mask for said first work area, said method further includes steps of:
(g) forming a second resist film at least on said second work area after execution of said step (e), and
(h) patterning said second resist film to obtain a second resist pattern for an etching mask for said second work area, and said step (f) includes a step of executing said predetermined etching using said second resist pattern as a mask in addition to said first resist pattern.

16. The method of manufacturing a semiconductor device according to claim 15, further comprising steps of:
(i) performing chemical reaction acceleration for accelerating decomposition at least on said second resist pattern before said step (f) and after said step (h), and
(j) performing said curing at least on said second resist pattern before said step (f) and after said step (h).

17. The method of manufacturing a semiconductor device according to claim 14, wherein said chemical reaction acceleration includes at least either exposure or heat treatment on said etching object.

18. A method of manufacturing a semiconductor device comprising steps of:
(a) forming an etching object having first and second work areas on a semiconductor substrate;
(b) forming a first resist film on said etching object;
(c) patterning said first resist film to obtain a first resist pattern on said first work area;
(d) performing curing including one of ion implantation, electron beam irradiation and ultraviolet irradiation on said first resist pattern, the thickness of said first resist pattern contracting by said curing in said step (d);
(e) forming a second resist film at least on said second work area after execution of said step (d);
(f) patterning said second resist film to obtain a second resist pattern for an etching mask for said second work area; and
(g) executing predetermined etching on said etching object using said first and second resist patterns as masks to obtain a work pattern.

* * * * *